US012598994B2

(12) United States Patent
Lee et al.

(10) Patent No.: US 12,598,994 B2
(45) Date of Patent: Apr. 7, 2026

(54) MULTILAYER ENCAPSULATION FOR HUMIDITY ROBUSTNESS AND RELATED FABRICATION METHODS

(71) Applicant: Cree, Inc., Durham, NC (US)

(72) Inventors: Kyoung-Keun Lee, Cary, NC (US); Fabian Radulescu, Chapel Hill, NC (US); Scott Sheppard, Chapel Hill, NC (US); Daniel Namishia, Wake Forest, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/335,796

(22) Filed: Jun. 1, 2021

(65) Prior Publication Data

US 2022/0384366 A1    Dec. 1, 2022

(51) Int. Cl.
H01L 21/56        (2006.01)
H10W 42/00        (2026.01)
(Continued)

(52) U.S. Cl.
CPC ........... H10W 42/00 (2026.01); H10W 74/01 (2026.01); H10W 74/43 (2026.01)

(58) Field of Classification Search
CPC . C04B 41/009; C04B 35/565; C04B 41/5042; C04B 41/52; C04B 41/5024; C04B 41/89; C04B 35/584; C04B 41/4527; C04B 41/522; C04B 41/5037; C04B 41/4529; C04B 41/5031; C04B 41/5035; C04B 41/0072; C04B 41/4558; C04B 41/87; C04B 2111/00405; C04B 2235/3225; C04B 41/5071; C04B 41/5096; C04B 2235/3213; C04B 2235/3463; C04B 35/185; C04B 35/486; C04B 41/5027; C04B 41/53; C04B 2235/3215; C04B 2235/3224; C04B 35/195; C04B 41/5044;
(Continued)

(56) References Cited

U.S. PATENT DOCUMENTS 4,593,302  A  *  6/1986  Lidow ................. H01L 29/0696
                                                    257/E29.066
5,214,636  A  *  5/1993  Ishikawa ................ G11B 7/253
(Continued)

FOREIGN PATENT DOCUMENTS

CN        1807357  A    7/2006
CN        101024324  A    8/2007
(Continued)

OTHER PUBLICATIONS

Notification of Transmittal of the International Search Report and the Written Opinion of the International Searching Authority, or the Declaration, in corresponding PCT Application No. PCT/US2022/030619 (Nov. 8, 2022).

*Primary Examiner* — Leonard Chang
*Assistant Examiner* — Tsz K Chiu
(74) *Attorney, Agent, or Firm* — Myers Bigel, P.A.

(57)        ABSTRACT

A semiconductor die includes a semiconductor body, and a multi-layer environmental barrier on the semiconductor body. The multi-layer environmental barrier includes first and second sublayers of first and second oxide materials, respectively, where the first oxide material is different than the second oxide material. Related devices and fabrication methods are also discussed.

39 Claims, 12 Drawing Sheets

(51) Int. Cl.
　　*H10W 74/01* 　　　(2026.01)
　　*H10W 74/43* 　　　(2026.01)

(58) Field of Classification Search
CPC ....... C04B 41/5066; C04B 2111/00482; C04B 2235/3208; C04B 2235/3227; C04B 2235/3427; C04B 2235/5244; C04B 2235/5248; C04B 35/16; C04B 35/58085; C04B 41/4539; C04B 41/4556; C04B 41/4582; C04B 41/5032; C04B 41/5051; C04B 41/5059; C04B 2111/2084; C04B 2201/32; C04B 2235/3229; C04B 2235/3244; C04B 2235/3246; C04B 2235/3481; C04B 2237/341; C04B 2237/365; C04B 2237/368; C04B 28/006; C04B 35/573; C04B 35/62863; C04B 35/80; C04B 41/4531; C04B 41/4537; C04B 41/455; C04B 41/5045; C04B 2103/0021; C04B 2103/60; C04B 2111/20; C04B 2235/3206; C04B 2235/3217; C04B 2235/3232; C04B 2235/3251; C04B 2235/3256; C04B 2235/3279; C04B 2235/3286; C04B 2235/3418; C04B 2235/3436; C04B 2235/3454; C04B 2235/3873; C04B 2235/3891; C04B 2235/40; C04B 2235/404; C04B 2235/428; C04B 2235/5224; C04B 2235/5228; C04B 2235/524; C04B 2235/5252; C04B 2235/6025; C04B 2235/6027; C04B 2235/614; C04B 2235/616; C04B 2235/6581; C04B 2235/661; C04B 2235/76; C04B 2235/77; C04B 2235/80; C04B 2235/96; C04B 2235/9607; C04B 2235/9684; C04B 2237/08; C04B 2237/345; C04B 2237/348; C04B 2237/38; C04B 2237/708; C04B 2237/84; C04B 35/01; C04B 35/10; C04B 35/495; C04B 35/50; C04B 35/505; C04B 35/58092; C04B 35/597; C04B 35/64; C04B 35/83; C04B 37/003; C04B 37/005; C04B 41/4505; C04B 41/4584; C04B 41/48; C04B 41/5025; C04B 41/5063; C04B 41/5067; H01L 2924/0002; H01L 51/5237; H01L 21/045; H01L 21/3145; H01L 21/318; H01L 21/3185; H01L 2924/00; H01L 29/1608; H01L 29/2003; H01L 29/24; H01L 2924/12044; H01L 51/448; H01L 51/5256; H01L 2924/09701; H01L 21/4867; H01L 21/6835; H01L 2221/68359; H01L 2224/05624; H01L 23/4985; H01L 25/0655; H01L 25/50; H01L 27/14601; H01L 2924/01019; H01L 2924/01046; H01L 2924/01057; H01L 2924/01079; H01L 2924/13091; H01L 2924/3025; H01L 29/405; H01L 29/6606; H01L 29/732; H01L 29/74; H01L 29/78; H01L 29/868; H01L 29/872; H01L 31/03921; H01L 31/1055; H01L 21/7682; H01L 23/5222; H01L 23/53223; H01L 23/53228; H01L 23/53238; H01L 23/5329; H01L 23/562; H01L 27/16; H01L 28/20; H01L 31/02167; H01L 31/0749; H01L 51/0096; H01L 51/0097; H01L 2251/566; H01L 23/564; H01L 27/1425; H01L 29/66462; H01L 29/7787; H01L 31/022425; H01L 31/0296; H01L 31/0322; H01L 31/0368; H01L 31/048; H01L 31/075; H01L 51/003; H01L 51/5203; H01L 51/5206; H01L 51/5253; H01L 51/56; H01L 21/0237; H01L 21/02439; H01L 21/02521; H01L 29/12; H01L 31/0256; H01L 33/26; H01L 23/3135; H01L 23/3192; H01L 31/0488
See application file for complete search history.

(56) 　　　　　References Cited

U.S. PATENT DOCUMENTS

| | | | | |
|---|---|---|---|---|
| 5,686,360 A * | 11/1997 | Harvey, III | ........ | H10K 50/8445 |
| | | | | 438/126 |
| 6,169,308 B1 * | 1/2001 | Sunami | ................. | H10B 12/00 |
| | | | | 257/E27.098 |
| 6,246,076 B1 | 6/2001 | Lipkin et al. | | |
| 6,607,852 B2 | 8/2003 | Nagaraj et al. | | |
| 7,483,462 B2 * | 1/2009 | Johnson | ................ | B82Y 20/00 |
| | | | | 372/45.01 |
| 7,525,122 B2 * | 4/2009 | Ring | ................... | H01L 21/3185 |
| | | | | 257/E29.104 |
| 9,812,338 B2 * | 11/2017 | Ring | ................... | H01L 23/3135 |
| 10,707,858 B2 | 7/2020 | Das et al. | | |
| 2002/0109168 A1 * | 8/2002 | Kim | ...................... | H10B 53/00 |
| | | | | 257/E21.59 |
| 2003/0044552 A1 * | 3/2003 | Komada | ................. | B32B 27/08 |
| | | | | 428/35.7 |
| 2003/0085652 A1 | 5/2003 | Weaver | | |
| 2003/0089928 A1 * | 5/2003 | Saito | ................... | H01L 23/5329 |
| | | | | 257/E21.585 |
| 2003/0117066 A1 * | 6/2003 | Silvernail | ......... | H10K 50/8445 |
| | | | | 313/504 |
| 2003/0117068 A1 | 6/2003 | Forrest et al. | | |
| 2003/0209708 A1 * | 11/2003 | Kubota | ............. | H10K 50/8445 |
| | | | | 257/40 |
| 2004/0202097 A1 * | 10/2004 | Oyake | ................ | G11B 7/24079 |
| | | | | 369/283 |
| 2005/0023974 A1 | 2/2005 | Chwang et al. | | |
| 2005/0233484 A1 * | 10/2005 | Stein | ...................... | H01L 33/44 |
| | | | | 438/22 |
| 2007/0001174 A1 * | 1/2007 | Ring | ................... | H01L 21/3145 |
| | | | | 257/E29.1 |
| 2007/0184286 A1 * | 8/2007 | Nakayama | ........... | C04B 35/645 |
| | | | | 428/432 |
| 2008/0035934 A1 * | 2/2008 | Sheppard | ........... | H01L 21/3145 |
| | | | | 257/E29.1 |
| 2008/0157291 A1 * | 7/2008 | Li | ........................... | H01L 21/56 |
| | | | | 257/E21.24 |
| 2008/0174457 A1 * | 7/2008 | Minakawa | ............... | G10C 3/12 |
| | | | | 341/22 |
| 2009/0291293 A1 * | 11/2009 | Sakakura | .......... | H01B 13/0026 |
| | | | | 428/323 |
| 2009/0297703 A1 * | 12/2009 | Li | ....................... | C03C 17/3417 |
| | | | | 427/163.3 |
| 2010/0176383 A1 * | 7/2010 | Park | ................... | H10K 59/1213 |
| | | | | 438/46 |
| 2010/0193772 A1 * | 8/2010 | Morosawa | .......... | H01L 29/7869 |
| | | | | 257/E29.1 |
| 2012/0219808 A1 * | 8/2012 | Raybould | ............... | F01D 5/288 |
| | | | | 428/446 |
| 2012/0281452 A1 * | 11/2012 | Huo | ........................ | H10B 63/20 |
| | | | | 257/4 |
| 2013/0147022 A1 * | 6/2013 | Yoon | ................... | H01L 23/3192 |
| | | | | 257/637 |
| 2013/0320564 A1 * | 12/2013 | Brain | ............... | H01L 21/76807 |
| | | | | 438/618 |
| 2013/0344319 A1 * | 12/2013 | Zhu | ......................... | C22C 29/18 |
| | | | | 428/335 |
| 2014/0097469 A1 * | 4/2014 | Hagleitner | ............ | H01L 23/291 |
| | | | | 257/256 |

(56)  References Cited

U.S. PATENT DOCUMENTS

| | | | |
|---|---|---|---|
| 2014/0103363 A1 | 4/2014 | Ring et al. | |
| 2014/0264297 A1* | 9/2014 | Kumar | H10K 50/844 |
| | | | 257/40 |
| 2014/0264960 A1 | 9/2014 | Ring et al. | |
| 2015/0187855 A1* | 7/2015 | Yamazaki | H10K 71/80 |
| | | | 257/43 |
| 2015/0221891 A1 | 8/2015 | Ghosh et al. | |
| 2015/0271911 A1 | 9/2015 | Chen et al. | |
| 2015/0333083 A1 | 11/2015 | Lai | |
| 2016/0093748 A1* | 3/2016 | Mieczkowski | H01L 29/0692 |
| | | | 438/572 |
| 2017/0294532 A1* | 10/2017 | Kudymov | H01L 29/7786 |
| 2018/0217299 A1* | 8/2018 | Takahashi | G02B 1/18 |
| 2019/0385954 A1* | 12/2019 | Rondon | H01L 23/3192 |
| 2021/0257448 A1 | 8/2021 | Sampayan et al. | |
| 2022/0384366 A1 | 12/2022 | Lee et al. | |

FOREIGN PATENT DOCUMENTS

| | | | | |
|---|---|---|---|---|
| JP | 6211168 B2 * | 9/2014 | | H01L 257/40 |
| JP | 2016506315 A | 3/2016 | | |
| WO | 2012039310 A1 | 3/2012 | | |
| WO | 2022256196 A1 | 12/2022 | | |

* cited by examiner

MULTILAYER ENCAPSULATION FOR HUMIDITY ROBUSTNESS AND RELATED FABRICATION METHODS

FIELD

The present invention relates to semiconductor devices, and more particularly, to environmental protection of semiconductor devices and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 3.2 eV for 4H—SiC at room temperature) and the Group III nitrides (e.g., with a bandgap of about 3.36 eV for gallium nitride (GaN) at room temperature). As used herein, the term "Group III nitride" refers to those semiconducting compounds formed between nitrogen (N) and the elements in Group III of the periodic table, usually aluminum (Al), gallium (Ga), and/or indium (In). The term refers to binary, ternary, and quaternary compounds, such as GaN, AlGaN, and AlInGaN. These compounds have empirical formulas in which one mole of nitrogen is combined with a total of one mole of the Group III elements. These materials may have higher electric field breakdown strengths and higher electron saturation velocities as compared to GaAs and Si.

Semiconductor devices fabricated from SiC and/or Group III nitrides may include power transistor devices, such as field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc. These devices are typically passivated with an oxide layer, such as silicon dioxide ($SiO_2$), to protect the exposed surfaces of the device and/or other reasons. The interface between the semiconductor body and the oxide layer, however, may be insufficient to obtain a high surface mobility of electrons. For example, the interface between SiC and $SiO_2$ conventionally exhibits a high density of interface states, which may reduce surface electron mobility and introduce carrier traps, which in turn can reduce the desired performance characteristics of devices.

Accordingly, semiconductor devices, including those that include oxide layers, may also incorporate one or more layers of silicon nitride (e.g., amorphous silicon nitride, SiNx) to improve the resulting electronic properties, e.g., as described in U.S. Pat. No. 6,246,076. SiN may also provide an environmental barrier, without which the structure and operation of the device may be susceptible to environmental degradation, regardless of the presence of an oxide layer. For example, semiconductor devices may be required to operate in high temperature and/or high humidity environments. If moisture is allowed to reach the semiconductor devices, corrosion may occur, which may degrade performance of the semiconductor devices.

As an environmental barrier, SiN may form a better seal over the device in comparison to $SiO_2$, reducing or preventing contaminants such as water from reaching the epitaxial layers of the device and causing degradation. Plasma Enhanced Chemical Vapor Deposition (PECVD) may be used to form SiN as an environmental barrier for a semiconductor device, e.g., as described in U.S. Pat. No. 7,525, 122. However, a PECVD SiN layer may be prone to defects, such as pin holes and columnar structures, which can allow moisture to penetrate the SiN layer and reach the device.

SUMMARY

According to some embodiments of the present invention, a semiconductor die includes a semiconductor body, and a multi-layer environmental barrier on the semiconductor body. The multi-layer environmental barrier includes first and second sublayers of first and second oxide materials, respectively, where the first oxide material is different than the second oxide material.

In some embodiments, the first and second sublayers may be Atomic Layer Deposition (ALD) layers.

In some embodiments, at least one of the first or second oxide material may have a density that is greater than silicon nitride.

In some embodiments, at least one of the first or second oxide material may be an insulating metal oxide.

In some embodiments, the first and second sublayers may be included in a repeating layer structure, and wherein the first and second oxide materials comprise the insulating metal oxide and a non-metal oxide, respectively.

In some embodiments, the insulating metal oxide may be at least one of aluminum oxide, zirconium oxide, or hafnium oxide.

In some embodiments, the insulating metal oxide may be aluminum oxide, and wherein the non-metal oxide comprises silicon oxide.

In some embodiments, a ratio of a thickness of the first sublayer to a thickness of the second sublayer may be about 2:1 or more, about 5:1 or more, or about 8:1 or more.

In some embodiments, a passivation layer may be provided between the semiconductor body and the multi-layer environmental barrier. For example, the passivation layer may include silicon nitride.

In some embodiments, a surface of the multi-layer environmental barrier opposite the passivation layer may include a layer of silicon oxide or silicon nitride.

In some embodiments, the first oxide material may have a different diffusion coefficient with respect to water than the second oxide material.

In some embodiments, a gate, a source contact, and a drain contact may be provided on the semiconductor body, and a passivation layer may extend on the gate, the source contact, and the drain contact. The first and second sublayers may conformally extend on the passivation layer with respective thicknesses that are substantially uniform along the gate, the source contact, and the drain contact.

In some embodiments, the first and second sublayers may be included in a repeating layer structure. The multi-layer environmental barrier may include at least two of the repeating layer structure, at least ten of the repeating layer structure, or at least twenty of the repeating layer structure.

In some embodiments, a total thickness of the multi-layer environmental barrier may be about 500 Angstroms to about 3000 Angstroms.

In some embodiments, the repeating layer structure may be a binary structure in which the first and second sublayers are stacked; a ternary structure in which the first sublayer, the second sublayer, and a third sublayer are stacked; and/or a quaternary structure in which the first sublayer, the second sublayer, a third sublayer, and a fourth sublayer are stacked.

According to some embodiments of the present invention, a semiconductor die includes a semiconductor body, and a multi-layer environmental barrier on the semiconductor body. The multi-layer environmental barrier includes a repeating layer structure having two or more sublayers of respective insulating materials, where at least one of the respective insulating materials has a density that is greater than silicon nitride.

In some embodiments, the two or more sublayers may be Atomic Layer Deposition (ALD) layers.

In some embodiments, the density of the at least one of the respective insulating materials may be greater than a density of at least one other of the respective insulating materials.

In some embodiments, the at least one of the respective insulating materials may be a metal oxide, and at least one other of the respective insulating materials may be a non-metal oxide.

In some embodiments, the metal oxide may be aluminum oxide, zirconium oxide, or hafnium oxide.

In some embodiments, the non-metal oxide may be silicon oxide.

In some embodiments, a passivation layer may be provided between the semiconductor body and the multi-layer environmental barrier.

In some embodiments, a ratio of respective thicknesses of first and second sublayers of the two or more sublayers may be about 2:1 or more, about 5:1 or more, or about 8:1 or more.

In some embodiments, a gate, a source contact, and a drain contact may be provided on the semiconductor body, and a passivation layer may extend on the gate, the source contact, and the drain contact. The two or more sublayers may conformally extend on the passivation layer with respective thicknesses that are substantially uniform along the gate, the source contact, and the drain contact.

In some embodiments, at least two of the respective insulating materials may have different diffusion coefficients with respect to water.

According to some embodiments of the present invention, a semiconductor die includes a semiconductor body, and a multi-layer environmental barrier on the semiconductor body. The multi-layer environmental barrier includes a repeating layer structure having a first insulating sublayer and a second insulating sublayer. A ratio of a first thickness of the first insulating sublayer to a second thickness of the second insulating sublayer is about 2:1 or more.

In some embodiments, the first and second insulating sublayers may be first and second materials, respectively, and a density of the first material may be greater than a density of the second material.

In some embodiments, the density of at least one of the first material or the second material may be greater than silicon nitride.

In some embodiments, the first and second insulating sublayers may be Atomic Layer Deposition (ALD) layers.

In some embodiments, the first material may be a metal, and the second material may be a non-metal.

In some embodiments, the first material may be aluminum oxide, zirconium oxide, hafnium oxide, or silicon nitride.

In some embodiments, the second material may be silicon oxide.

In some embodiments, the first material may have a different diffusion coefficient with respect to water than the second material.

According to some embodiments of the present invention, a method of fabricating a semiconductor die includes providing a semiconductor body, and forming a multi-layer environmental barrier on the semiconductor body. The multi-layer environmental barrier includes first and second sublayers of first and second oxide materials, respectively, where the first oxide material is different than the second oxide material.

In some embodiments, forming the multi-layer environmental barrier on the passivation layer may include forming the first and second sublayers by Atomic Layer Deposition (ALD).

In some embodiments, forming the multi-layer environmental barrier may include alternatingly performing a first ALD process to form the first sublayer and a second ALD process to form the second sublayer on the first sublayer to define a repeating layer structure.

In some embodiments, at least one of the first or second oxide material may have a density that is greater than silicon nitride.

In some embodiments, at least one of the first or second oxide material may be an insulating metal oxide.

In some embodiments, another of the first and second oxide materials may be a non-metal oxide.

In some embodiments, the insulating metal oxide may be at least one of aluminum oxide, zirconium oxide, or hafnium oxide.

In some embodiments, the insulating metal oxide may be aluminum oxide, and the non-metal oxide may be silicon oxide.

In some embodiments, a passivation layer may be formed on the semiconductor body prior to forming the multi-layer environmental barrier.

In some embodiments, a gate, a source contact, and a drain contact may be formed on the semiconductor body. A passivation layer may be formed on the gate, the source contact, and the drain contact. The first and second sublayers may conformally extend on the passivation layer with respective thicknesses that are substantially uniform along the gate, the source contact, and the drain contact.

In some embodiments, a surface of the multi-layer environmental barrier opposite the semiconductor body may include a layer of silicon oxide or silicon nitride.

In some embodiments, the first oxide material may have a different diffusion coefficient with respect to water than the second oxide material.

In some embodiments, the semiconductor die may include a High Electron Mobility Transistor.

In some embodiments, the semiconductor die may include a Metal Oxide Semiconductor Field Effect Transistor.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 6A is a cross-sectional view of a HEMT device; FIG. 6B is an enlarged view of the passivation layer and multi-layer environmental barrier shown in FIG. 6A; and FIG. 6C is an enlarged view of the multi-layer environmental barrier shown in FIG. 6B.

DETAILED DESCRIPTION

Figure 1:
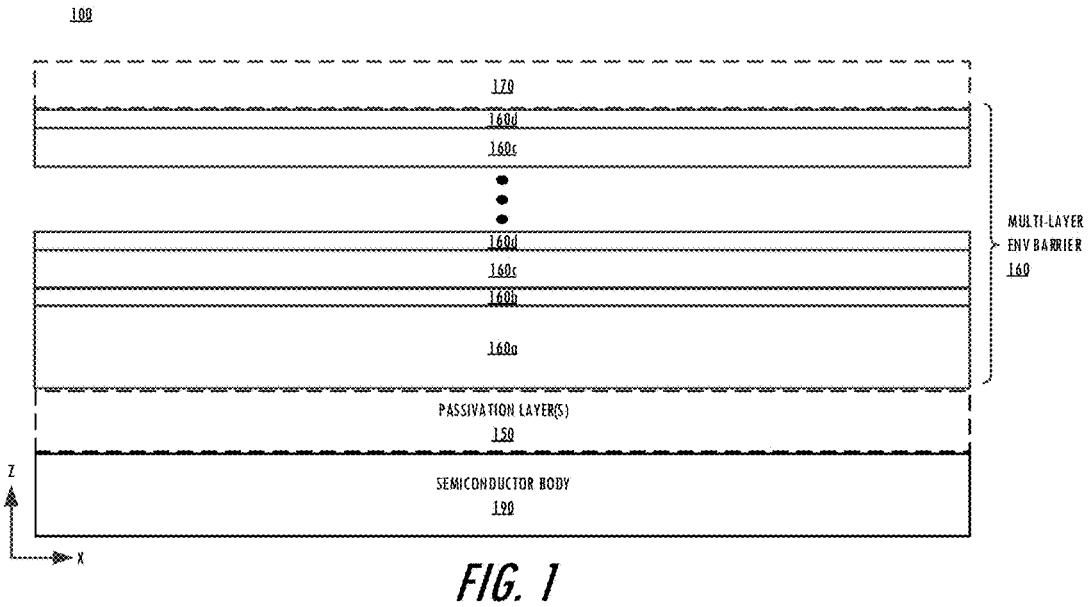
FIG. 1 is a schematic cross-sectional view of a semiconductor device including a multi-layer environmental barrier according to some embodiments of the present invention.

Packages for some semiconductor devices may not provide a hermetic seal for environmental protection in some applications. The environment may include an operating environment (i.e., when operating under bias in user application) or a fabrication environment (i.e., under processing conditions that may include different ionic contaminant profiles, such as integration, package technologies, etc.). An environmental barrier may thus be provided on semiconductor devices (also referred to as a die-level environmental barrier) as protection from humidity and/or other conditions of the environment. As used herein, a "die" or chip may refer to a small block or body of semiconducting material or other substrate on which electronic circuit elements are fabricated. A die may include a large number of individual "unit cell" transistor structures, which in some implementations may be connected electrically in parallel or in series. A semiconductor die as described herein may include the semiconductor body as well as the metal and/or insulating layers that are formed thereon.

One implementation of a die-level environmental barrier may be a topmost or final passivation film, which is typically a single layer deposited by chemical vapor deposition (CVD). The material selection for the final passivation film may be dictated by the desired diffusion barrier properties, with the function being to prevent various contaminant species present in the humid environment from reaching the active area of the semiconductor die. For example, in addition to water vapor, a high humidity environment may also include trace elements of various atomic, molecular and ionic contaminant species. Examples of various ionic species may include, but are not limited to, halogens (e.g., Cl−, F−, Br−, etc.), molecular ions (e.g., OH—, $NO_2$−, $NO_3$−, $PO_4$−, $SO_4$−, etc.), cations (e.g., Na+, K+, Au+, Ti+, etc.), and weak organic acids (e.g., carbonates, acetates, etc.). Such ionic species may be a source of degradation for an electrical device under bias, as the electric field can accelerate the ionic movement or diffusion through the humidity protection layers. For example, a PECVD SiN layer may be susceptible to oxidation, etching, and/or corrosion in the presence of contaminant halogens (e.g., F− and Cl−), in addition to being susceptible to moisture ingress due to defects (such as pin holes and/or columnar structures) therein. The presence of such contaminants may be a common occurrence and may be provided from multiple sources.

Some embodiments of the present invention may arise from realization that, given the wide variety of possible contaminant species, the choice of the protective film material may represent a non-ideal trade-off. Embodiments of the present invention thus provide a protective film including multiple stacked sublayers of various insulating materials (such as dielectric materials) having different characteristics, also referred to herein as a multi-layer environmental barrier film or stack or structure, or simply multi-layer environmental barrier. The multi-layer environmental barrier may include respective insulating sublayers having different diffusion barrier properties, so as to protect the semiconductor die against not only water molecules, but also against various ionic species that may be present in the environment. That is, stacking sublayers of various insulating materials with different diffusion coefficients (e.g., with respect to water molecules) can provide a humidity barrier that targets the movement of various ionic trace elements, in addition to water molecules in the environment.

As discussed herein, the multi-layer environmental barrier is a low-defect, highly conformal material stack. In particular, the multi-layer environmental barrier may include two or more sublayers of various materials and/or thicknesses (e.g., as an alternating or repeating layer structure in some embodiments) in order to target different contaminant species and provide a more robust humidity diffusion barrier for a semiconductor device. Some embodiments described herein may provide a multi-layer environmental barrier that replaces SiN or includes additional sublayers of different insulating materials in combination with (e.g., alternating with) SiN sublayers, which may reduce defect formation and/or slow down the effects of halogens, thereby improving the diffusion barrier properties of the stack. In some embodiments, at least one of the sublayers may include a material having a density that is greater than SiN, which may impede humidity and/or other contaminant ingress. More generally, the selection of different characteristics for the sublayers and/or additional interfaces defined between the sublayers as described herein may provide increased barriers to propagation of defects or contaminants.

FIG. 1 is a schematic cross-sectional view of a semiconductor device or die 100 including a multi-layer environmental barrier according to some embodiments of the present invention. As shown in FIG. 1, a multi-layer environmental barrier film or stack 160 is provided on a semiconductor body 190 to protect the semiconductor body 190 from humidity and/or other conditions of the environment. The semiconductor body 190 may be provided on a substrate (shown in subsequent figures as 122), such as a silicon carbide (SiC) substrate. The semiconductor body 190 may be a SiC- and/or Group III nitride-based material in some embodiments. A portion of the semiconductor body 190 may define a channel region of a transistor device. Metal layers and/or other structures of such transistor devices are not shown in FIG. 1.

In some embodiments, an optional (indicated by dashed lines) passivation layer or layer structure 150 may be provided on a surface of a semiconductor body 190, and the multi-layer environmental barrier 160 may be provided on the passivation layer(s) opposite the semiconductor body 190. The passivation structure 150 may be configured to reduce parasitic capacitance, reduce charge trapping, and/or otherwise improve electronic properties of one or more layers of the semiconductor body 190. When present, the passivation structure 150 may include one or more layers of SiN, for example, as deposited by CVD. More generally, the passivation structure 150 may be a multi-layered deposition using a deposition method other than atomic layer deposition (ALD).

The multi-layer environmental barrier 160 includes two or more sublayers 160a-60d of respective insulating materials having different characteristics formed in a stacked structure. In some embodiments, the sublayers 160a-60d may be alternatingly stacked in a periodic or other repeating layer structure. For example, the multi-layer stack 160 may include a binary stack (including two sublayers 160a, 160b in each period, e.g., AlOx-SiOx), a ternary stack (including three sublayers 160a, 160b, 160c in each period, e.g., AlOx-SiOx-HfOx), or a quaternary stack (including four sublayers 160a, 160b, 160c, 160d in each period, e.g., AlOx-SiOx-HfOx-ZrOx). More generally, multi-layer environmental barriers 160 as described herein are not limited as to the number of sublayers 160a-60d in each repeating structure or period. Likewise, multi-layer environmental barriers 160 as described herein are not limited as to the number of repeating structures or periods in the stack. The multi-layer stack 160 may also include combinations of different repeating layer structures, e.g., a repeating structure of a quaternary stack on binary stack, in some instances with one or more intervening layers. The repeating layer structures may be periodic or non-periodic. In some embodiments, the multi-layer environmental barrier 160 may include at least two repeating layer structures or periods, at least ten repeating layer structures or periods, or at least 20 repeating layer structures or periods. Each repeating layer structure may have a thickness of about more than about 5 nanometers (nm) (about 50 Angstroms (Å)), for example, about 10 nm (100 Å). The multi-layer environmental barrier 160 may thus have a total thickness of about 500 Å to about 3000 Å, for example, more than about 1000 Å, more than about 1500 Å, or about 2000 Å or more.

The different characteristics of two or more of the sublayers 160a-60d within each periodic or repeating layer structure may provide respective diffusion barrier properties. The respective diffusion barrier properties may be defined by the material composition and/or thickness of each sublayer 160a-160d. For example, insulating sublayers of comparatively denser materials (e.g., having a density greater than silicon nitride, such as aluminum oxides or other insulating metal oxides) and/or comparatively greater thicknesses may provide better protection against ingress of water/humidity and/or various ionic species that may be present in the environment. Insulating sublayers of other materials (e.g., semiconductor oxides, such as silicon oxides) may provide better protection against etchants and/or other subsequent fabrication conditions. A topmost sublayer 160d of the stack 160 (or an additional capping layer 170 on the topmost sublayer 160d) may be a non-metal insulating material (e.g., silicon oxide or silicon nitride) that protects underlying layers from subsequent chemical processing conditions (e.g., basic etch chemistries). In addition, respective interfaces between a multi-layer stack of the sublayers 160a-160d having different characteristics can provide barriers that prevent defects and/or contaminants of one sublayer from propagating to the next sublayer in the stack 160. Accordingly, stacking multiple sublayers 160a-160d of various materials and/or thicknesses (e.g., in a repeating layer structure) that are each configured based on a respective contaminant or environmental condition may provide protection against multiple contaminant species.

That is, a multi-layer environmental barrier 160 including a combination of sublayers 160a-160d with different diffusion barrier properties can be tailored to protect against ingress of a wider range of contaminant species than any one sublayer. Such contaminant species may include, but are not limited to, halogens (Cl−, F−, Br−), molecular ions (OH—, $NO_2-$, $NO_3-$, $PO_4-$, $SO_4-$, etc.), cations (Na+, K+, Au+, Ti+, etc.), and weak organic acids (carbonates, acetates, etc.) For instance, the sublayer 160a may include a material composition and/or thickness that provides a low diffusion coefficient with respect to water, the sublayer 160b may include a material composition and/or thickness that provides a low diffusion coefficient with respect to halogen-based ionic species, the sublayer 160c may include a material composition and/or thickness that provides a low diffusion coefficient with respect to non-halogen-based ionic species, and the sublayer 160d may include a material composition and/or thickness that provides protection against basic chemical compounds. In some embodiments, the different sublayers 160a-160d may be deposited using a same deposition technique, such as ALD, which may allow for fabrication of the entire multi-layer stack structure 160 in the same process chamber or otherwise without breaking vacuum in the process chamber.

The combination of different material compositions, thicknesses, and/or other characteristics of the respective sublayers 160a-60d may be varied or otherwise customized for different applications or environments, and/or may provide a combination of characteristics for use in multiple applications or environments. For example, multi-layer environmental barrier structures 160 as described herein may include sublayers 160a-60d with respective compositions that vary depending on environmental conditions or contaminants that may be specific to particular package types, such as the example package types shown in FIGS. 8A to 8C. It will be understood that the package types illustrated herein are provided by way of example rather than limitation. Additional example package types that may be associated with specific contaminants include, but are not limited to, through-hole-based, surface-mount-based, chip carrier, pin grid array, flat, Small Outline Integrated Circuit (SOIC), chip-scale, ball grid array, transistor/diode/small pin count IC, and/or multi-chip packages, including ceramic or plastic packages. As another example, multi-layer environmental barrier structures 160 as described herein may include sublayers 160a-60d that are each configured to provide a diffusion barrier against respective conditions or contaminants, to provide a multi-layer environmental barrier 160 including a combination of sublayers 160a-160d that may be universally applied in multiple different environments or applications.

Figure 2:
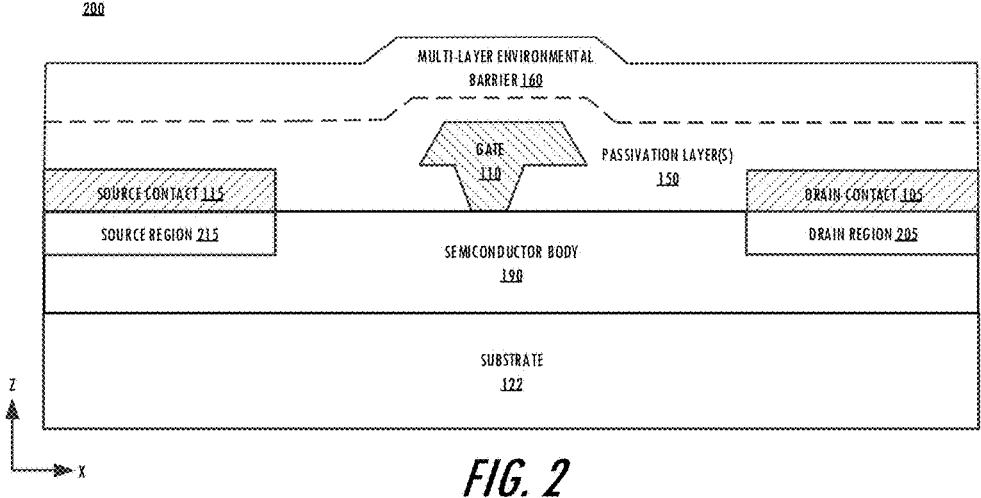
FIGS. 2, 3, and 4 are schematic cross-sectional views of transistor devices including a multi-layer environmental barrier according to some embodiments of the present invention.
Figure 3:
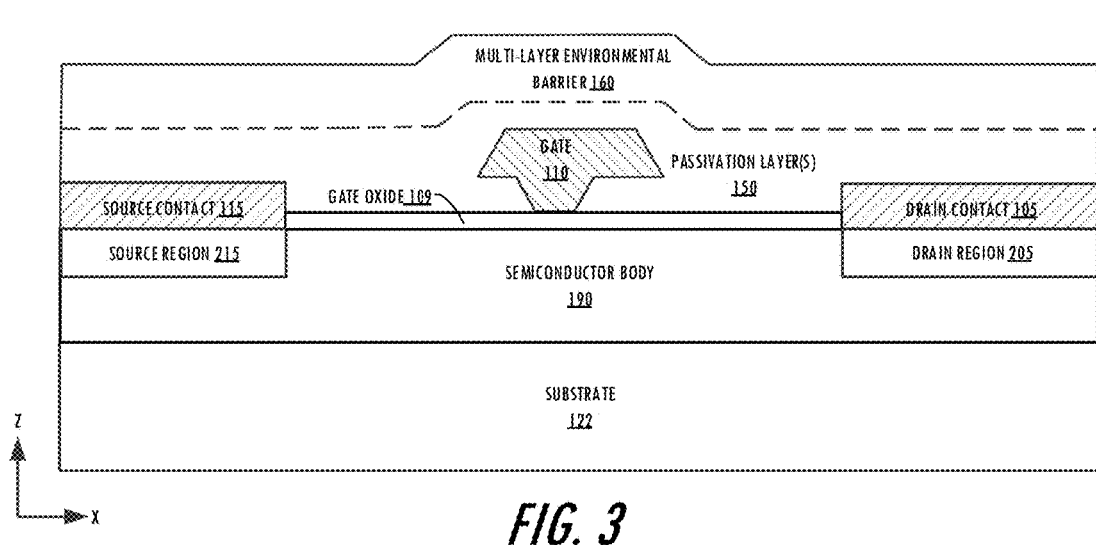
Figure 4:
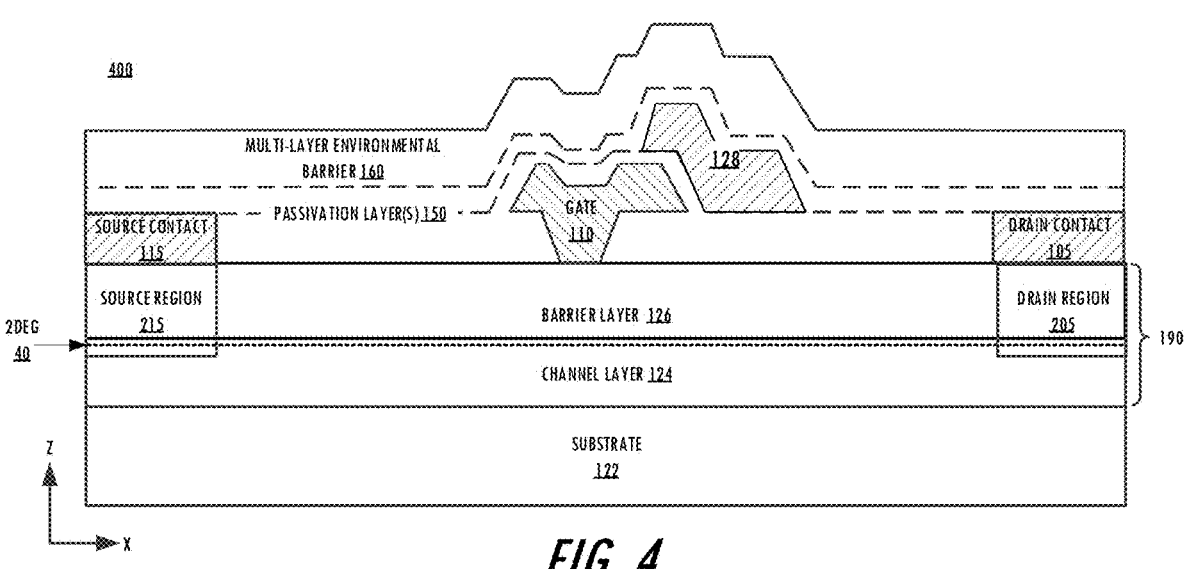

FIGS. 2, 3, and 4 are schematic cross-sectional views of transistor devices including a multi-layer environmental barrier according to some embodiments of the present invention. As shown in FIGS. 2, 3, and 4, transistor devices 200, 300, and 400 are formed on a substrate 122 such as, for example, a silicon carbide substrate. The illustrated devices 200, 300, 400 represent unit cell transistor structures of a semiconductor die, where hundreds or thousands of unit cell transistor structures may be formed on a semiconductor substrate 122 and electrically connected (e.g., in parallel). The substrate 122 may be a semi-insulating SiC substrate. However, embodiments of the present invention may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 122 may be a SiC wafer, and the devices 200, 300, 400 may be formed, at least in part, via wafer-level processing, and the wafer may then be diced or otherwise singulated to provide a die including a plurality of the unit cell transistor structures.

The semiconductor body 190 may be a semiconductor layer structure including one or more layers formed by epitaxial growth. The layer(s) of the semiconductor body 190 may include one or more wide bandgap materials such as, for example, one or more Group III nitride-based layers. For example, the semiconductor body 190 may be formed of one or more layers of GaN or AlGaN. However, other Group III nitride materials may be used. As another example, both the substrate 122 and the semiconductor body 190 may be formed of SiC.

A source region 215 and a drain region 205 are formed in the semiconductor body 190, for example, by implanting appropriate ions into a surface of the semiconductor body 190 to achieve a desired doping concentration. A source contact 115 is formed by one or more metallic layers on the surface of the semiconductor body 190 over the source region 215. Likewise, a drain contact 105 is formed by one or more metallic layers on the surface of the semiconductor body 190 over the drain region 205. The source and drain contacts 115 and 105 may provide low-resistance ohmic contacts to the source and drain regions 215 and 205, respectively. A gate 110 is formed by one or more metallic layers on a surface of the semiconductor body 190 between the source region 215 and the drain region 205.

FIG. 2 illustrates a Metal-Semiconductor Field Effect Transistor (MESFET) device 200, where the region of the semiconductor body 190 between the source and drain regions 215 and 205 provides the conduction channel or channel region of the MESFET 200. FIG. 3 illustrates a Metal-Oxide Semiconductor Field Effect Transistor (MOSFET) device 300, where the region of the semiconductor body 190 between the source and drain regions 215 and 205 provides the channel region of the MOSFET 300, and the gate 110 is separated from the channel region by a gate oxide layer 109. FIG. 4 illustrates a High Electron Mobility Transistor (HEMT) device 400, where the semiconductor body 190 includes a lower bandgap channel layer 124 on the substrate 122, and a higher bandgap barrier layer 126 on the channel layer 124 opposite the substrate 122. A 2DEG conduction channel 40 can be induced in the region of the semiconductor body 190 between the source and drain regions 215 and 205 along the heterointerface between the channel layer 124 and the barrier layer 126. In some embodiments, the substrate 122 includes SiC, the channel layer 124 includes GaN, and the barrier layer 126 includes AlGaN. A metal field plate 128 may also be provided, and in some embodiments may be electrically connected to the gate 110 (which may reduce the peak electric field, thereby increasing breakdown voltage and reducing high-field charge trapping effects), or may be electrically connected to the source contact 115 (which may reduce the gate-to-drain capacitance ($C_{gd}$), enhance gain, and/or improve linearity of the device 400).

One or more insulator layers (for example, one or more passivation layers) 150 are formed on the surface of the semiconductor body 190. The passivation layer(s) 150 may passivate surface states and/or otherwise improve electrical properties along the surface or interface with the semiconductor body 190. The passivation layer(s) 150 may include SiN, and may be deposited by a CVD process (such as PECVD) or other non-ALD process in some embodiments. While discussed primarily herein with reference to SiN passivation layer(s) 150, it will be understood that the passivation layer(s) 150 are not limited to SiN.

The transistor devices 200, 300, and 400 each include a multi-layer environmental barrier 160. An optional capping layer, such as the non-metal oxide- or nitride-based capping layer 170 of FIG. 1, is not shown for ease of illustration. The examples of FIGS. 2, 3, and 4 are intended to illustrate that the multi-layer environmental barrier 160 is not limited to use with any particular transistor structure, but rather, can be utilized as an environmental barrier for any suitable semiconductor device. As such, further details as to the operations of the devices 200, 300, and 400 will not be described in detail herein.

The multi-layer environmental barrier 160 includes multiple insulating sublayers (such as dielectric sublayers) having different characteristics (such as different material compositions and/or thicknesses). As shown in FIGS. 2, 3, and 4, the multi-layer environmental barrier layer 160 conformally covers the various elements of the transistor devices 200, 300, 400. In some embodiments, the multiple sublayers of the multi-layer environmental barrier 160 may be oxide layers of different materials that are deposited using the same process tool chamber, or otherwise without breaking vacuum in the process chamber. For example, the respective sublayers of the multi-layer environmental barrier 160 may be deposited using ALD, which may allow for deposition of a structure 160 including sublayers with a high degree of conformality and thickness uniformity in the same process chamber.

Using multiple sublayers of different material compositions and/or thicknesses as described herein may provide substantially improved environmental barrier properties as compared to some conventional environmental barriers, such as those including alternating oxide and nitride sublayers. Without being bound to any particular theory, it has been recognized that such SiN sublayers may be susceptible to oxidation, etching, and/or corrosion in the presence of contaminant halogens, such as F– and Cl–. In addition, it has been recognized that ALD-based layers may offer improved conformality, which may be beneficial and/or critical for humidity protection; however, SiN is typically deposited by CVD, which may result in defects (e.g., pin holes, columnar structures). Also, deposition of conventional alternating oxide and nitride sublayers in the same may be problematic, due to cross-contamination issues. It has been further recognized that thicker and/or denser insulating films or sublayers (such as insulating metal oxides) may provide improved contaminant ingress protection. For example, AlO-, HfO-, and/or ZrO-based layers may have a higher density than SiN-based layers, and may provide better humidity protection. As such, in some embodiments, one or more sublayers of different insulating materials may be alternatingly stacked with (or may replace) conventional oxide or nitride sublayers to provide a multi-layer environmental barrier with different diffusion barrier properties, and thus, improved resistance to oxidation, etching, and/or corrosion with respect to multiple different contaminants or combinations of different contaminants.

The multiple material environmental barrier stack can be customized to address humid environments with different contaminant compositions, e.g. to provide a barrier to elements or chemicals other than (or in addition to) water. In some embodiments, at least one of the sublayers may differ in density and/or thickness from the materials of at least one other of the sublayers of the multi-layer environmental barrier. For example, respective insulating materials of at least one of the sublayers may have a density that is greater than SiN. In addition, non-metal insulating films or sublayers may be included in the stack to provide desired chemical processing protection. Combinations of stacked sublayers of different material compositions and/or different thicknesses (e.g., in repeating or periodic layer structures) as described herein can thus better protect against contaminant ingress and/or damage, while simultaneously providing protection against subsequent fabrication processes.

FIGS. 5A, 5B, 5C, 5D, and 5E are enlarged views of the transistor device of FIG. 2 illustrating various combinations of sublayers in multi-layer environmental barriers according to some embodiments of the present invention in greater detail. While shown in FIGS. 5A to 5E with reference to binary periodic structures $160'$, $160''$, $160'''$, $160^{(4)}$, $160^{(5)}$ including first and second sublayers alternatingly stacked on an optional passivation layer or layer structure 150, it will be understood that these structures $160'$, $160''$, $160'''$, $160^{(4)}$, $160^{(5)}$ are illustrated by way of example only, and that multi-layer environmental barriers $160'$, $160''$, $160'''$, $160^{(4)}$, $160^{(5)}$ (collectively 160) as described herein may include more than two sublayers having different characteristics (e.g., defining a ternary structure, a quaternary structure), and/or may be stacked in non-repeating layer structures or repeating layer structures that are periodic or non-periodic.

Figure 5A:
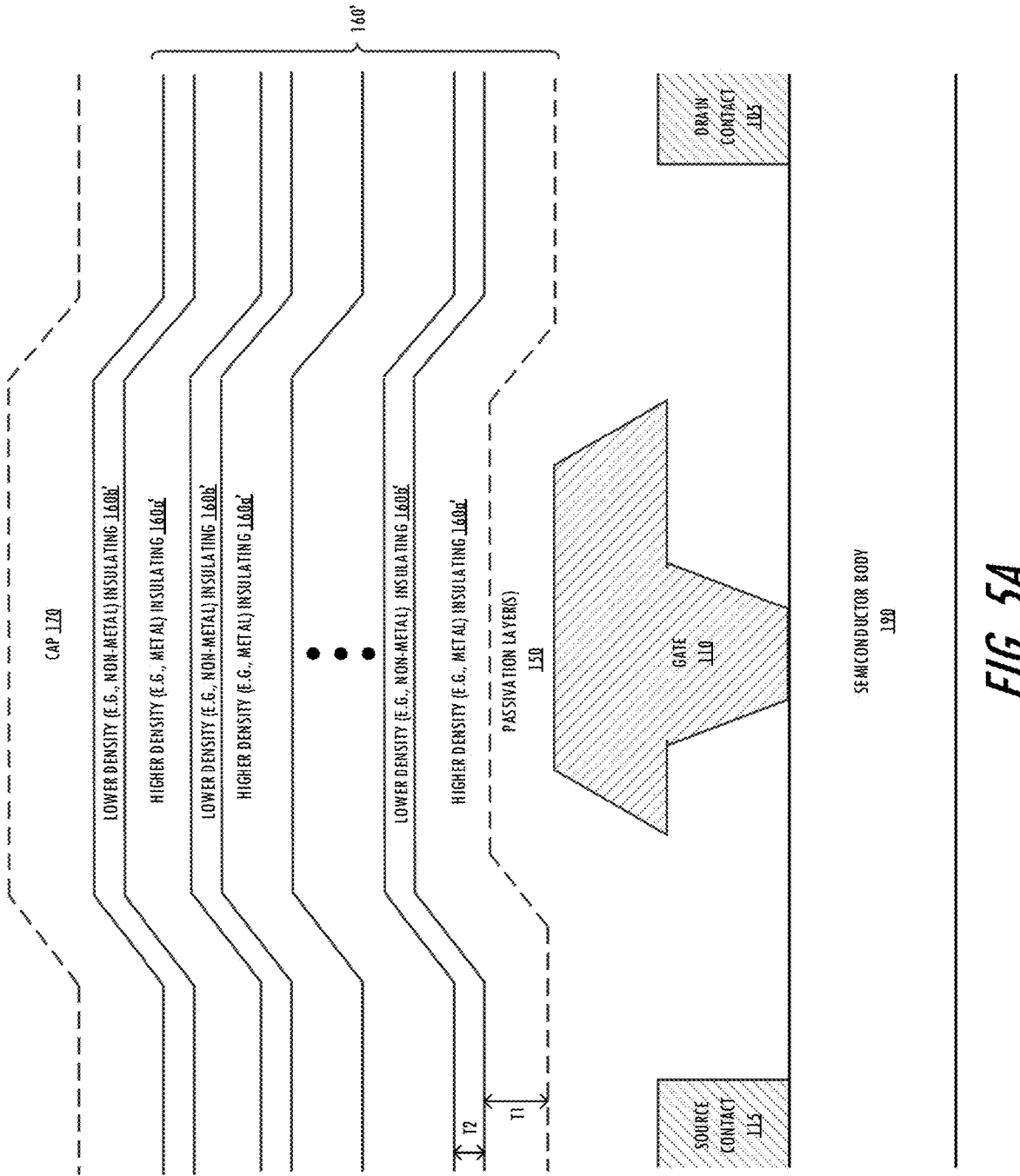
FIGS. 5A, 5B, 5C, 5D, and 5E are enlarged views of the transistor device of FIG. 2 illustrating sublayers of multi-layer environmental barriers according to some embodiments of the present invention in greater detail.

In the example of FIG. 5A, the multi-layer environmental barrier $160'$ includes a stack of sublayers $160a'$, $160b'$ of respective insulating materials that are alternatingly stacked to define periodic repeating layer structure, with each period including a first sublayer $160a'$ and a second sublayer $160b'$. One of the respective insulating materials of the first and second sublayers $160a'$, $160b'$ may have a comparatively higher density than the other. One or more of the sublayers $160a'$, $160b'$ may have a density that is greater than that of SiN. Another of the sublayers $160a'$, $160b'$ may have a density that is less than or equal to that of SiN. In FIG. 5A, the first sublayer $160a'$ includes a comparatively higher-density insulating material, and the second insulating sublayer $160b'$ includes a comparatively lower-density material. For example, the first insulating sublayer $160a'$ may include a metal insulating material, such as aluminum oxide (AlO), hafnium oxide (HfO), or zirconium oxide (ZrO), or other metal-rich insulating material. The second insulating sublayer $160b'$ may include a non-metal insulating material, for example, a semiconductor oxide or nitride, such as silicon oxide (SiO) or silicon nitride (SiN), or other metal-poor insulating material. Materials described herein with reference to compound chemical formulas (e.g., SiO) may include different stoichiometries or any compound of the constituent elements, and amorphous or crystalline states of the materials. Typical densities of SiO, SiN, AlO, ZrO, and HfO are 2.65, 3.17, 3.95, 5.68, and 9.68 grams per cubic centimeter (g/cm³), respectively. That, is with respect to material density, HfO>ZrO>AlO>SiN>SiO. Generally, a denser film may provide better water or other contaminant ingress prevention. For example, HfO and ZrO are denser than AlO and SiN and SiO, and thus, may better impede contaminant ingress.

Figure 5B:
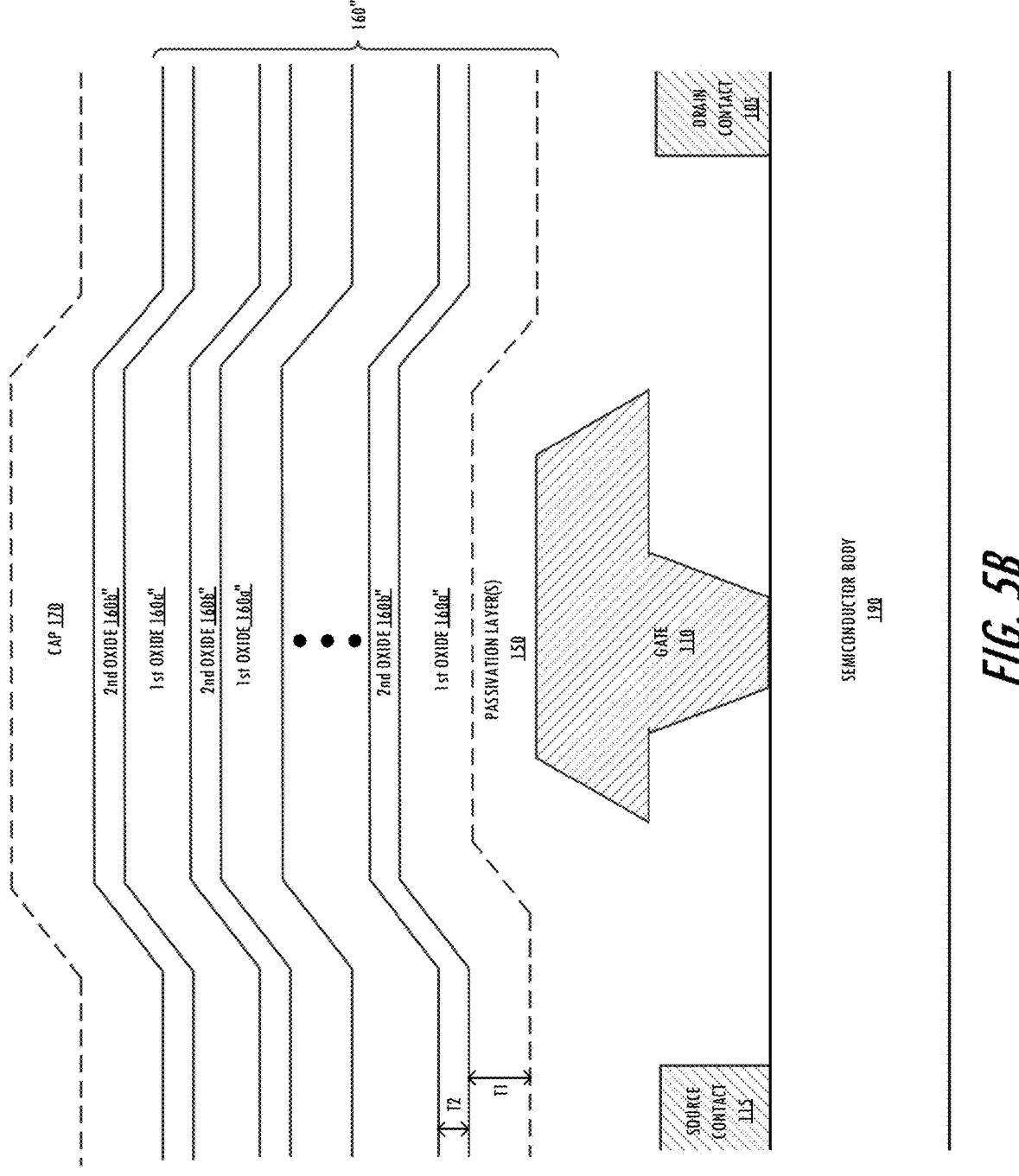
Figure 5C:
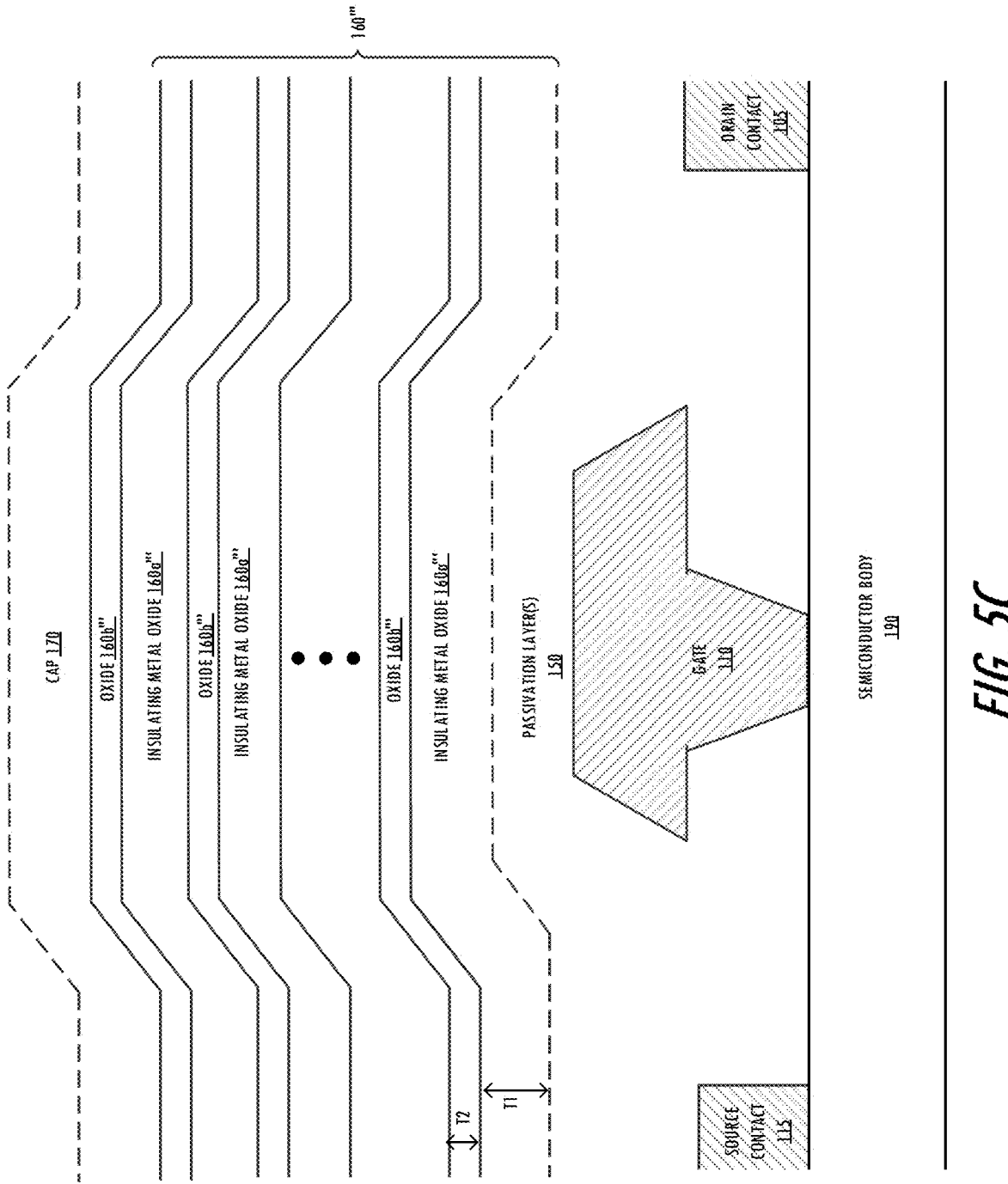
Figure 5D:
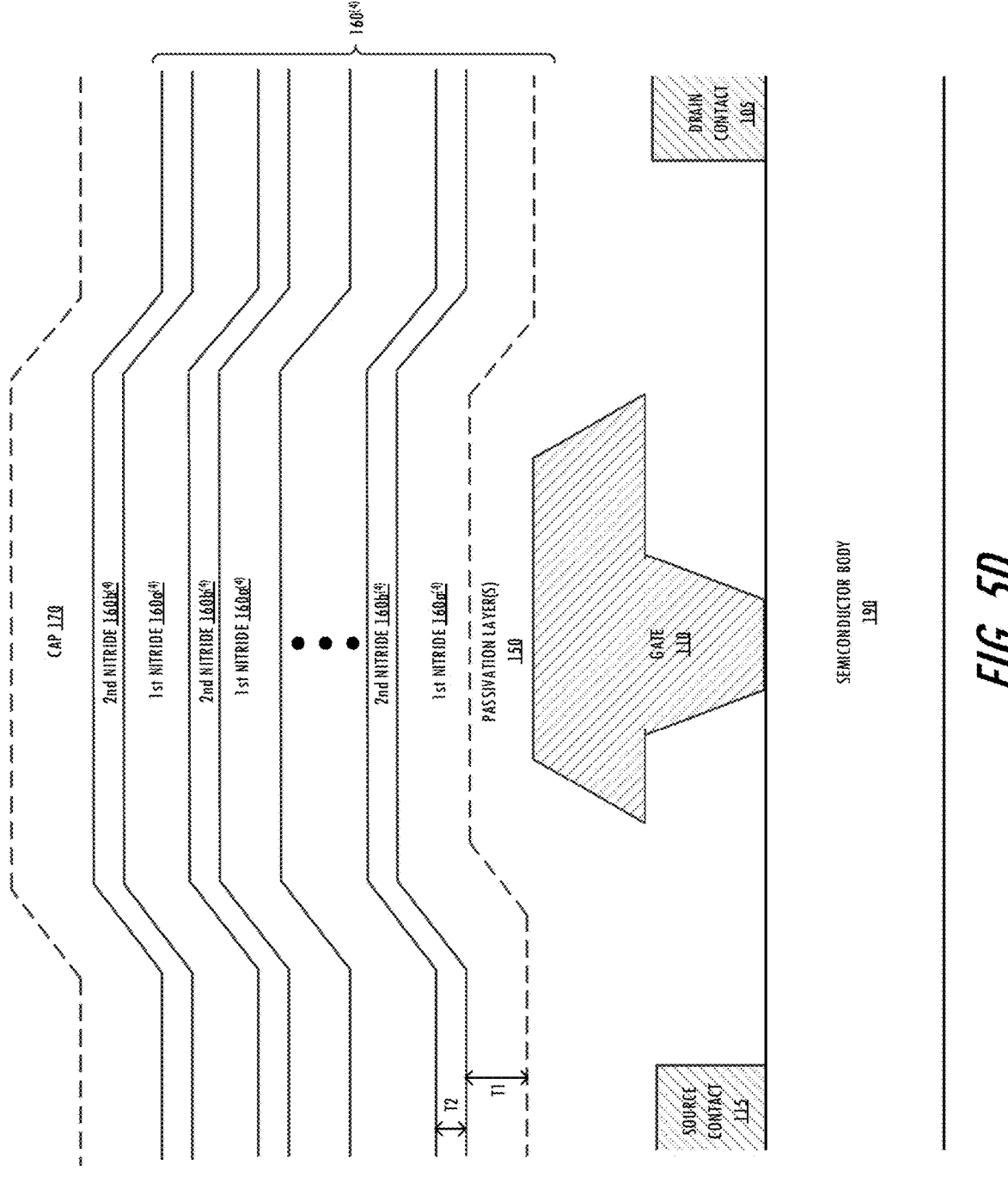
Figure 5E:
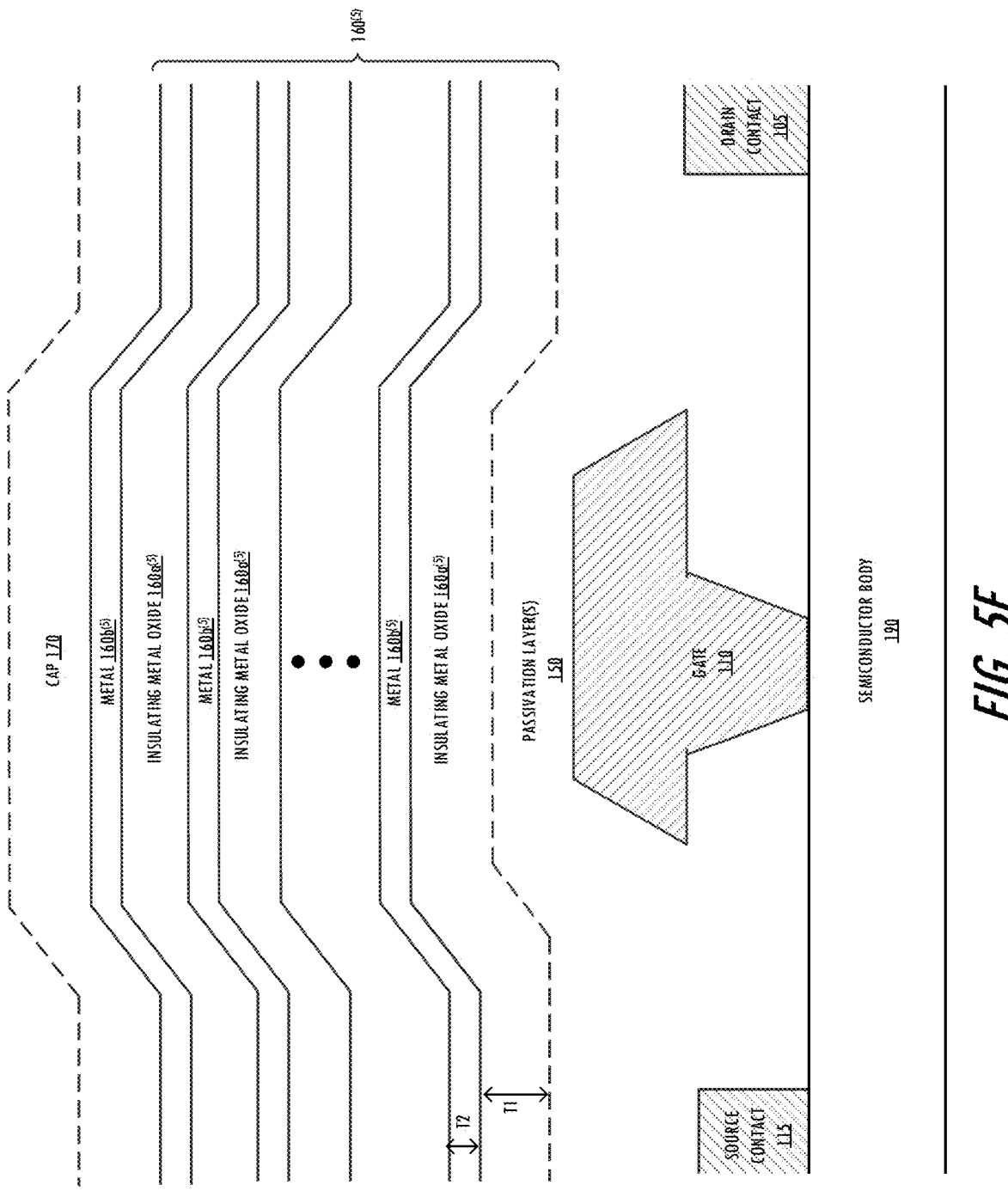

In the example of FIG. 5B, the multi-layer environmental barrier $160''$ includes a stack of sublayers $160a''$, $160b''$ of respective oxide materials that are alternatingly stacked to define periodic repeating layer structure, with each period including a first oxide sublayer $160a''$ and a second oxide sublayer $160b''$. The respective oxide materials of the first and second oxide sublayers $160a''$, $160b''$ may differ from one another in material composition. For example, the first oxide sublayer $160a''$ may include AlO, HfO, or ZrO, while the second oxide sublayer $160b''$ may include SiO. FIG. 5C illustrates a more specific example of the multi-layer environmental barrier $160'''$ including a first sublayer $160a'''$ of an insulating metal oxide material (e.g., AlO, HfO, or ZrO) and a second sublayer $160b'''$ of an insulating non-metal oxide material (e.g., SiO) alternatingly stacked in a periodic repeating layer structure. The multi-layer environmental barrier $160'''$ including the first and second sublayers $160a'''$ and $160b'''$ alternatingly stacked may thus alleviate the susceptibility to oxidation, etching, and/or corrosion of the non-metal oxide sublayers $160b'''$. In the example of FIG. 5D, the multi-layer environmental barrier $160^{(4)}$ includes a stack of sublayers $160aP)$, $160b^{(4)}$ of respective nitride materials that are alternatingly stacked to define periodic repeating layer structure, with each period including a first nitride sublayer $160a^{(4)}$ and a second nitride sublayer $160b^{(4)}$, where the respective nitride materials of the sublayers $160a^{(4)}$, $160b^{(4)}$ may differ from one another in material composition. FIG. 5E illustrates another example of the multi-layer environmental barrier $160^{(5)}$ including a first sublayer $160a^{(5)}$ of an insulating metal oxide material (e.g., AlO, HfO, or ZrO) and a second sublayer $160b^{(5)}$ of a metal material (e.g., Al, Au) alternatingly stacked in a periodic repeating layer structure, where the metal sublayers $160b^{(5)}$ may provide more effective barriers to humidity ingress.

As shown in FIGS. 5A to 5E, at least two of the sublayers of each period of the multi-layer environmental barrier 160 may have different thicknesses from one another. For example, a ratio of a thickness T1 of the first sublayer $160a'/160a''/160a'''/160a^{(4)}/160a^{(5)}$ (collectively $160a$) to a thickness T2 of a second sublayer $160b'/160b''/160b'''/160b^{(4)}/160b^{(5)}$ (collectively $160b$) may be greater than 2:1, greater than 5:1, greater than 8:1, or greater than 10:1 in some embodiments. The thickness ratios of the sublayers $160a$, $160b$ may be dependent or based on the respective densities of the different insulating materials. For example, in the illustrated binary periodic layer structures, the first, higher-density material sublayer $160a'$ may be deposited with a thickness T1 that is greater than the thickness T2 of the second, lower-density material sublayer $160b'$. Similarly, a multi-layer environmental barrier 160 including a ternary periodic layer structure or quaternary periodic layer structure may include three sublayers or four sublayers, respectively, where at least two of the sublayers in each period may differ in thickness.

While illustrated with reference to various sublayer material combinations in FIGS. 5A to 5E, it will be understood that multi-layer environmental barriers according to embodiments of the present invention are not limited to these specific materials. For example, in some embodiments, the sublayers $160a$, $160b$ may include organic materials and inorganic materials alternatingly stacked to define the multi-layer environmental barrier 160. In particular, in FIG. 5B, one of the oxide layers $160a''$, $160b''$ may be replaced by an organic material sublayer to define an alternating organic sublayer/oxide sublayer multi-layer environmental barrier 160″. Likewise, in FIG. 5B, one of the nitride layers 160a$^{(4)}$, 160b$^{(4)}$ may be replaced by an organic material sublayer to define an alternating organic sublayer/nitride sublayer multi-layer environmental barrier 160$^{(4)}$.

More generally, the multi-layer environmental barrier 160 illustrated in FIGS. 5A to 5E may include two or more sublayers 160a, 160b having different material compositions and the same thickness, same material compositions and different thicknesses, or different material compositions and different thicknesses. The two or more sublayers 160a, 160b may be stacked in repeating or non-repeating layer structures. The repeating layer structures may be periodic (having two or more periods) or non-periodic.

In particular embodiments of the multi-layer environmental barriers 160 shown in FIGS. 5A to 5C, the first sublayer 160a of each period may be AlO, and the second sublayer 160b of each period may be SiO. The SiO sublayers may be amorphous layers (e.g., silica) or crystalline (e.g., $SiO_2$). Likewise, the AlO sublayers may be amorphous layers (e.g., alumina) or crystalline layers (e.g., $Al_2O_3$). AlO may be relatively stable, and may be relatively easy to fabricate in comparison to some nitride materials (e.g., SiN) using widely available deposition tools. AlO may also have a higher density than SiN, and thus may provide an improved moisture barrier. The AlO sublayers may be multiple times thicker than the SiO sublayers, for example, as the deposition rate and/or density for AlO may be many times that of SiO. For example, the thickness T2 of the SiO sublayer may be less than about one-fourth or less than about one-fifth of the thickness T1 of the AlO sublayer in some embodiments. In particular embodiments, the respective thicknesses T1 and T2 of AlO and SiO sublayers in a multi-layer environmental barrier as described herein may be about 2 to 8 nm and 1 nm, respectively, such that the thickness ratio of AlO to SiO may be, for example, about 2:1 or more, about 5:1 or more, or about 8:1 or more.

Still referring to FIGS. 5A to 5E, a non-metal insulating layer, such as SiO or SiN, may be included as or on a topmost sublayer 160b of the multi-layer environmental barrier 160. For example, SiO may protect the underlying sublayers of the multi-layer environmental barrier structure 160 in further chemical processing, which may rely on basic (rather than acidic) chemistries. In some embodiments, the non-metal insulating layer may be implemented by the topmost sublayer 160b of the multi-layer environmental barrier 160. In other embodiments, the non-metal insulating layer may be implemented by an additional SiO or SiN capping layer 170 that is formed on the topmost sublayer 160b of the multi-layer environmental barrier 160. That is, a surface of the multi-layer environmental barrier 160 opposite the passivation layer 150 may be a non-metal insulating layer, or may have a non-metal insulating layer thereon.

In some embodiments, two or more sublayers of the multi-layer environmental barrier 160 may be formed by a conformal deposition process, such ALD. An ALD (sub) layer or ALD material may refer to a layer or material that is formed by ALD, including, but not limited to thermal ALD and plasma-enhanced ALD (PEALD) processes. The use of ALD to form multiple (or all) sublayers in the multi-layer stack 160 may allow for sublayers with a substantially uniform thickness that conformally extend along the underlying surface, thinner and with better step coverage than may be achieved by CVD. For example, ALD may achieve up to 100% conformality, in comparison to CVD sidewall coverage of about 80% of the top or planar thickness. As described herein, conformality of a layer along a particular surface may be expressed as a percentage of the thickness of the layer when deposited on a planar surface. ALD processes may also be advantageous in forming multi-layer stacks by allowing for fabrication of multiple thin sublayers in the same chamber, without additional wafer transfers (i.e., without breaking vacuum) and resets between the sub-steps (e.g., to avoid cross contamination).

Figures 6A, 6B, 6C:
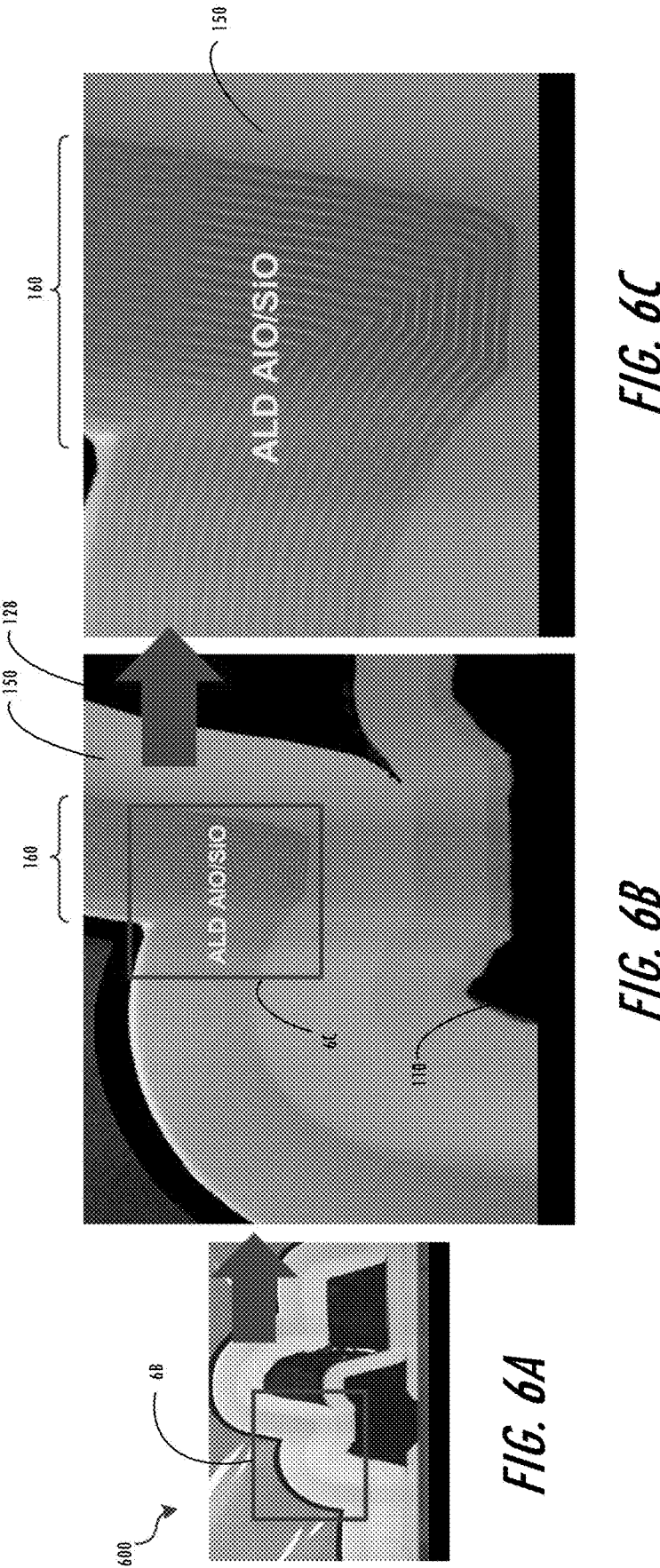
FIGS. 6A, 6B, and 6C are STEM images illustrating cross-sectional views of transistor devices including a multi-layer environmental barrier according to some embodiments of the present invention. In particular.

FIGS. 6A, 6B, and 6C are STEM images illustrating cross-sectional views of transistor devices including a multi-layer environmental barrier formed of ALD oxide sublayers according to some embodiments of the present invention. In particular, FIG. 6A is a cross-sectional view of a HEMT device 600. FIG. 6B is an enlarged view of the passivation layer 150 and multi-layer environmental barrier 160 shown in FIG. 6A. FIG. 6C is an enlarged view of the multi-layer environmental barrier 160 shown in FIG. 6B.

As shown in FIGS. 6A to 6C, the multi-layer environmental barrier 160 may be a binary stack including alternating sublayers of ALD SiO and ALD AlO. The ALD process may allow for deposition of AlO and SiO sublayers of substantially uniform thickness and high conformality (e.g., more than 80% and up to about 100% of a planar surface thickness). In particular, FIG. 6B illustrates that the AlO/SiO environmental barrier 160 substantially conforms to the shape of the underlying passivation layer 150, which is formed on the gate 110 and the field plate 128. Each of the AlO and SiO sublayers has a substantially uniform thickness and conformally extends along the shape defined by the passivation layer 150 and the underlying gate 110 and field plate 128 structures.

The AlO sublayers may have a relatively higher density and may thus provide improved humidity robustness as well improved protection against oxidation, etching, and/or corrosion by contaminant halogens, in comparison to SiN. The alternating SiO sublayers may define multiple AlO/SiO interfaces with the AlO layers, which can reduce or prevent defects and/or contaminants of one sublayer from propagating to the next sublayer in the stack 160. The SiO sublayers may also provide protection in subsequent processing (e.g., against basic etch chemistries). Additionally or alternatively, the multi-layer environmental barrier 160 may include sublayers of ALD HfO, ZrO, and/or SiN. In the example device 600 shown in FIGS. 6A to 6C, the topmost or terminating layer in the multi-layer environmental barrier 160 is an SiO sublayer. However, in other embodiments, an additional SiO or SiN capping layer 170 may be formed on the topmost sublayer of the multi-layer environmental barrier 160.

Figure 7A:
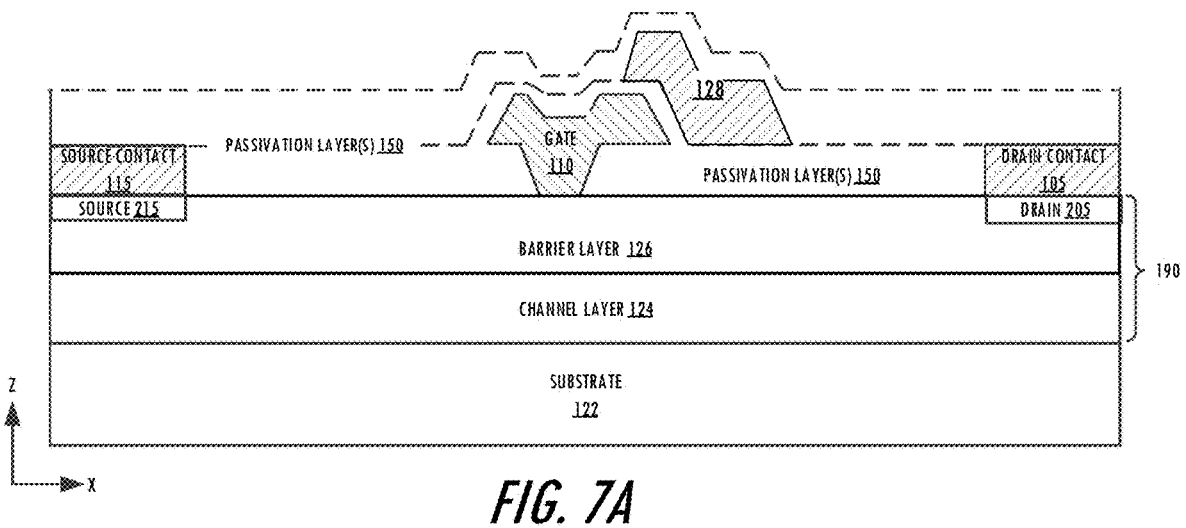
FIGS. 7A, 7B, 7C, and 7D are cross-sectional views illustrating intermediate fabrication steps in methods of fabricating a multi-layer environmental barrier on a transistor device according to some embodiments of the present invention.

FIGS. 7A, 7B, 7C, and 7D are cross-sectional views illustrating intermediate fabrication steps in methods of fabricating a multi-layer environmental barrier on a semiconductor device according to some embodiments of the present invention. As shown in FIG. 7A, a transistor structure includes a gate 110, source contact 115, and drain contact 105 on a semiconductor body 190 (illustrated in this example with reference to the HEMT device 400 of FIG. 4, including a channel layer 124 and a barrier layer 126 on a substrate 122). A passivation layer or layer structure 150, such as a SiN-based passivation layer, is formed on the gate 110 and portions of the semiconductor body 190 between the gate and the source and drain contacts 115 and 105.

A metal field plate 128 is formed on the passivation layer(s) 150. While illustrated as including a stepped profile conformally extending along the passivation layer(s) 150 with a first step portion adjacent or overlapping the gate 110 and a second step portion adjacent the drain contact 105, the field plate 128 may be implemented in various configurations in accordance with embodiments of the present invention. For example, the field plate 128 may have a substantially planar profile extending along a portion of the passivation layer(s) 150 between the gate 110 and drain contact 105 or between the gate 110 and source contact 115, and/or may be laterally spaced apart from the gate 110 so as to be free of overlap with the gate 110 in the vertical direction (Z–) direction.

Figure 7B:
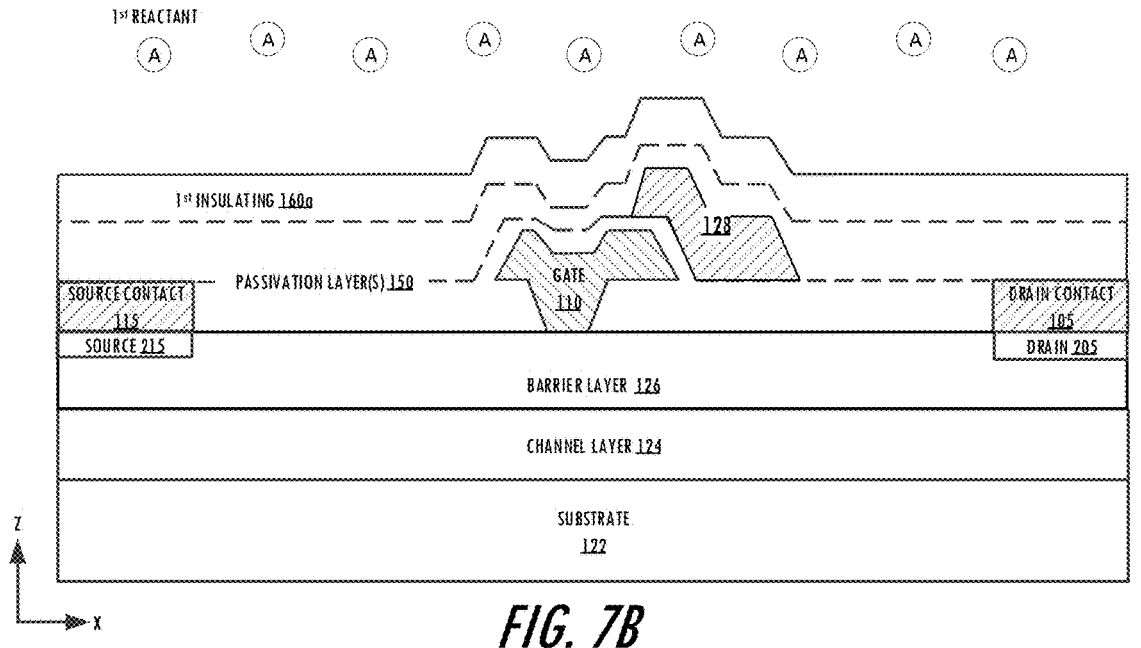
Figure 7C:
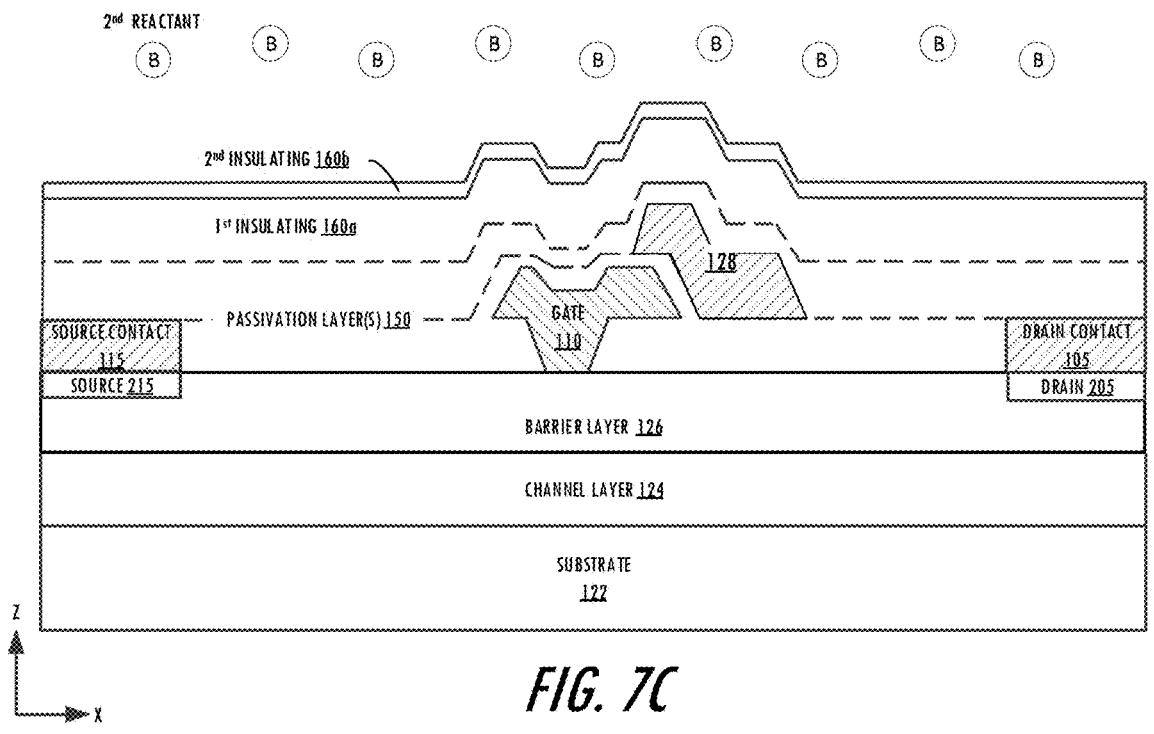

As shown in FIGS. 7B and 7C, an ALD process is performed to conformally deposit a first insulating sublayer 160a on the surface of the passivation layer(s) 150, and to conformally deposit a second insulating sublayer 160b on the surface of the first insulating sublayer 160a. For example, the first insulating sublayer 160a may include a metal insulating material, such as AlO, HfO, ZrO, or other metal oxide or insulating layer having a greater density than SiN. In some embodiments, the second insulating sublayer 160b may include a non-metal insulating material, such as SiO, SiN, or other non-metal oxide or insulating layer having a density less than or equal to SiN.

Figure 7D:
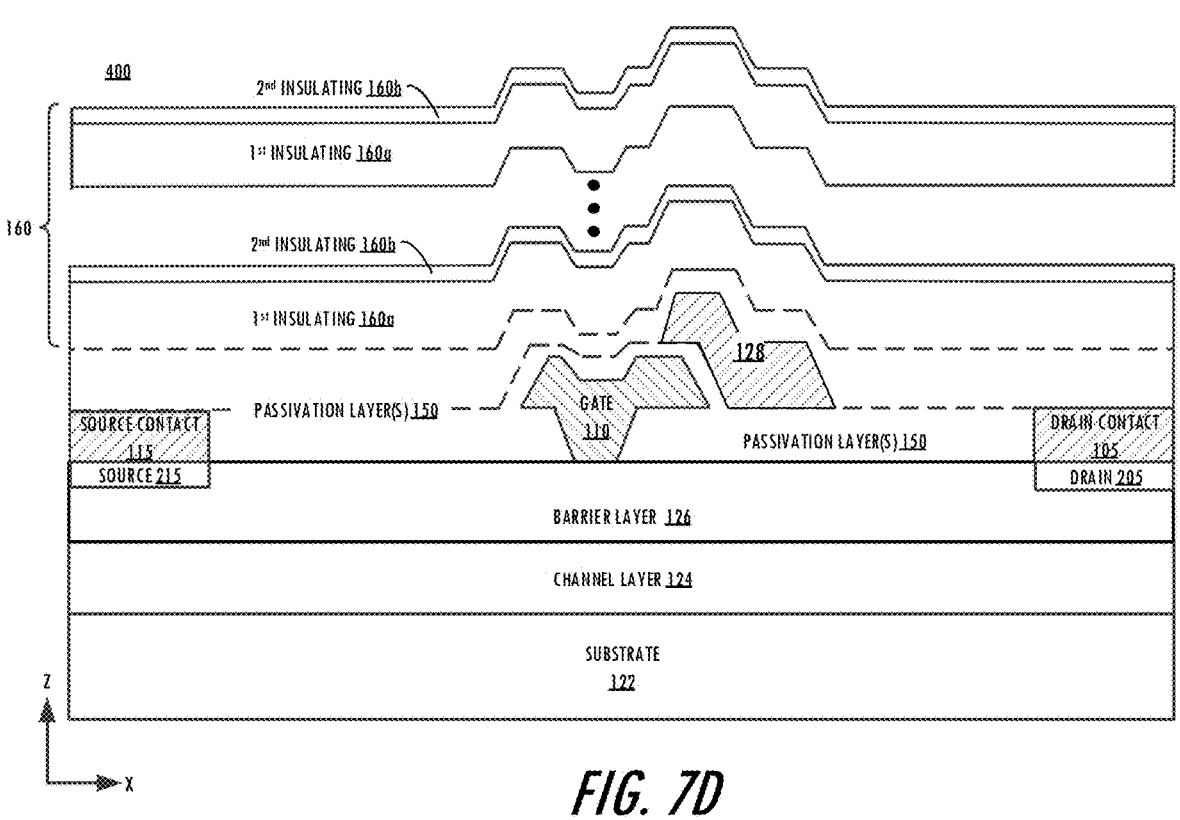

The ALD process may rely on alternated, self-limiting reactions between gaseous reactants and an exposed solid surface to deposit highly conformal insulating sublayers 160a, 160b with a substantially uniform thickness, which may be controllable at the submonolayer level. In particular, the semiconductor body 190 including the features 105, 110, 115, 128, and 150 formed thereon is exposed to two reactants, A (in FIG. 7B) and B (in FIG. 7C) in a sequential, non-overlapping manner in a process chamber. In FIG. 7B, reactant A reacts with a finite number of reactive sites on the exposed surfaces of the semiconductor body 190 and features to define the first sublayer 160a, and growth stops once the finite number of sites have been consumed, in a self-limiting manner. The remaining amounts of reactant A are evacuated from the chamber, and reactant B is introduced in FIG. 7C, without breaking vacuum in the chamber. Reactant B likewise reacts with a finite number of reactive sites on the exposed surfaces to define the second sublayer 160b, growth stops once the finite number of sites have been consumed, and the remaining amounts of reactant B are evacuated from the chamber. By alternating exposures to reactants A and B, a thin film multi-layer environmental barrier 160 including alternating sublayers 160a and 160b is deposited, as shown in FIG. 7D.

The ALD process deposits the sublayers 160a and 160b with a substantially uniform thickness and with high conformality on the complex underlying shapes or structures. For example, ALD may achieve conformality of up to 100% of the thickness of the planar portions of the sublayers 160a and 160b. ALD processes may also be advantageous in forming the multi-layer stack 160 by allowing for fabrication of multiple thin sublayers 160a, 160b in the same chamber, without additional wafer transfers (i.e., without breaking vacuum) and resets between the sub-steps (e.g., to avoid cross contamination).

In some embodiments, at lower temperatures, the ALD processes as shown in FIGS. 7B and 7C may produce amorphous films, which may be subsequently crystallized. For example, in some embodiments the first sublayer 160a may be deposited as amorphous AlO (also denoted as AlOx), which may be crystalized to form $Al_2O_3$. The second sublayer 160b may be deposited as amorphous SiO (also denoted as SiOx), which may be crystalized to form $SiO_2$. A non-metal oxide layer, such as SiO or SiN, may be formed as the topmost sublayer 160b of the multi-layer environmental barrier 160, or on the topmost sublayer 160b (e.g., as capping layer 170), using an ALD or a non-ALD process.

As noted above, multi-layer environmental barrier structures 160 as described herein may include sublayers having respective compositions that are selected based on environmental conditions/contaminants, which may be application-specific. For example, the environmental conditions/contaminants may be specific to particular semiconductor package types, including ceramic or plastic packages, such as open cavity, overmold, thermally-enhanced, through-hole-based, surface-mount-based, chip carrier, pin grid array, flat, Small Outline Integrated Circuit (SOIC), chip-scale, ball grid array, transistor/diode/small pin count IC, and/or multi-chip packages. As such, some embodiments described herein may provide multi-layer environmental barrier structures 160 including sublayers of respective materials that may be targeted to address specific package technologies.

Figure 8A:
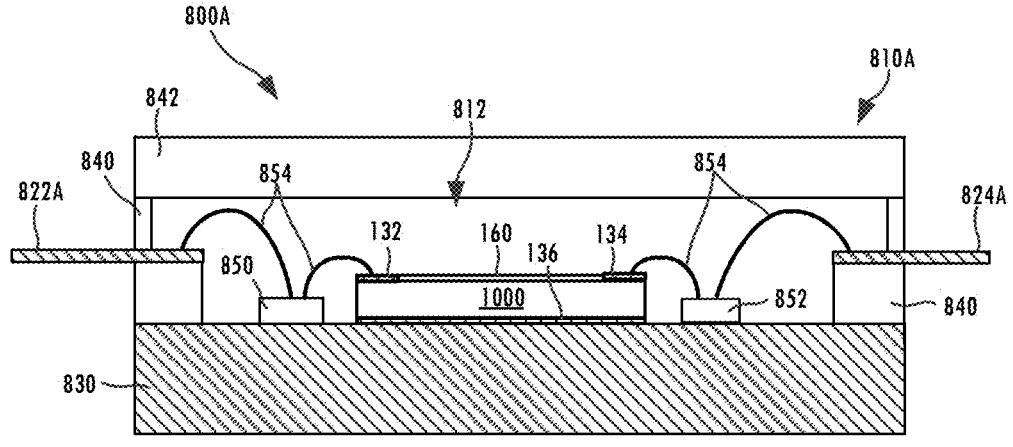
FIGS. 8A, 8B, and 8C are schematic cross-sectional views illustrating several example packages including transistor devices according to embodiments of the present invention to provide packaged transistor amplifiers.
Figure 8B:
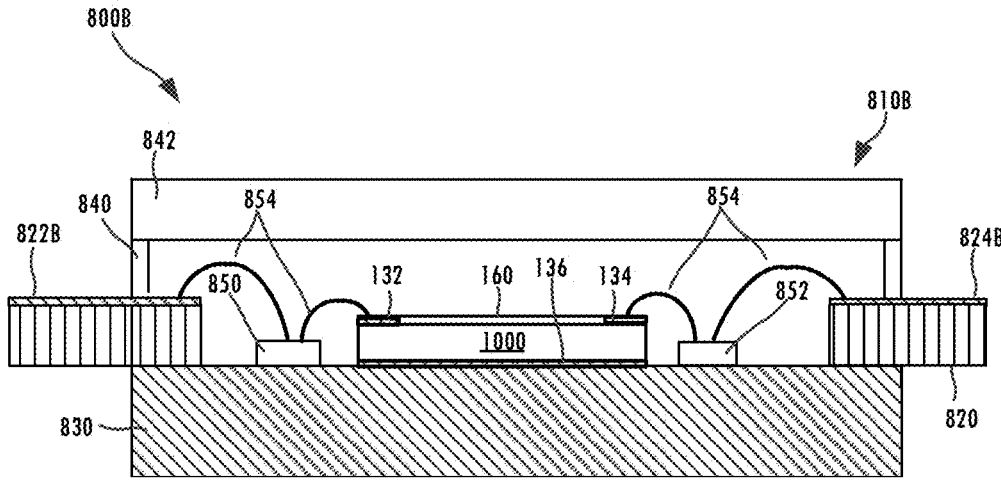
Figure 8C:
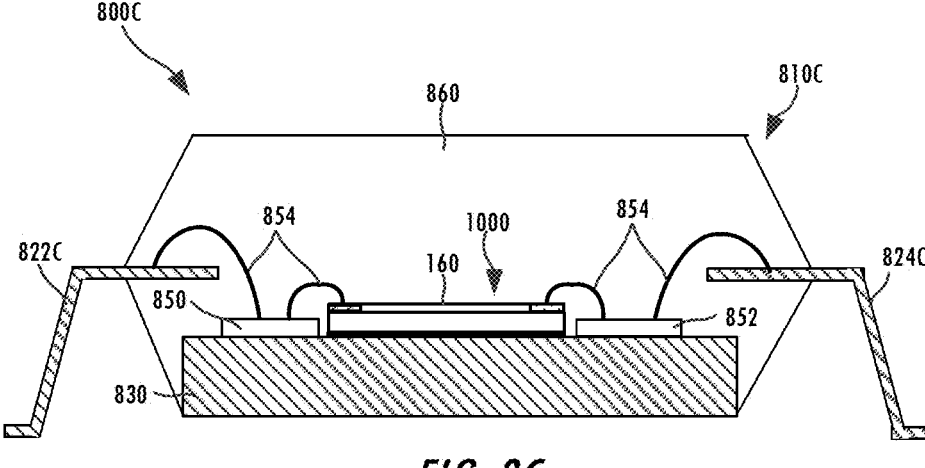

FIGS. 8A, 8B, and 8C are schematic cross-sectional views illustrating several example package types 800A, 800B, 800C, where each package technology 800A, 800B, 800C may include its own specific ionic or other contaminant content. FIGS. 8A-8C show packaging of a transistor device 1000, which may include any of the transistor structures 200, 300, 400 described herein.

In particular, FIG. 8A is a schematic side view of a package 800A for a Group III nitride-based RF transistor amplifier. As shown in FIG. 8A, packaged RF transistor amplifier 800A includes the RF transistor amplifier die 1000 packaged in an open cavity package structure 810A. The package structure 810A includes metal gate leads 822A, metal drain leads 824A, a metal submount 830, sidewalls 840 and a lid 842.

The submount 830 may include materials configured to assist with the thermal management of the package 800A. For example, the submount 830 may include copper and/or molybdenum. In some embodiments, the submount 830 may be composed of multiple layers and/or contain vias/interconnects. In an example embodiment, the submount 830 may be a multilayer copper/molybdenum/copper metal flange that comprises a core molybdenum layer with copper cladding layers on either major surface thereof. In some embodiments, the submount 830 may include a metal heat sink that is part of a lead frame or metal slug. The sidewalls 840 and/or lid 842 may be formed of or include an insulating material in some embodiments. For example, the sidewalls 840 and/or lid 842 may be formed of or include ceramic materials. In some embodiments, the sidewalls 840 and/or lid 842 may be formed of, for example, $Al_2O_3$. The lid 842 may be glued to the sidewalls 840 using an epoxy glue. The sidewalls 840 may be attached to the submount 830 via, for example, braising. The gate lead 822A and the drain lead 824A may be configured to extend through the sidewalls 840, though embodiments of the present invention are not limited thereto.

The RF transistor amplifier die 1000 is mounted on the upper surface of the metal submount 830 in an air-filled cavity 812 defined by the metal submount 830, the ceramic sidewalls 840 and the ceramic lid 842. Gate and drain terminals 132, 134 of RF transistor amplifier die 1000 are on the top side of the semiconductor structure 190, while the source terminal 136 is on the bottom side of the semiconductor structure 190. The source terminal 136 may be mounted on the metal submount 830 using, for example, a conductive die attach material (not shown). The metal submount 830 may provide the electrical connection to the source terminal 136 and may also serve as a heat dissipation structure that dissipates heat that is generated in the RF transistor amplifier die 1000.

Input matching circuits 850 and/or output matching circuits 852 may also be mounted within the package 800A. The matching circuits 850, 852 may include impedance matching and/or harmonic termination circuits. The impedance matching circuits may be used to match the impedance of the fundamental component of RF signals that are input to or output from the RF transistor amplifier to the impedance at the input or output of the RF transistor amplifier die 1000, respectively. The harmonic termination circuits may be used to ground harmonics of the fundamental RF signal that may be present at the input or output of the RF transistor amplifier die 1000. More than one input matching circuit 850 and/or output matching circuit 852 may be provided. As schematically shown in FIG. 8A, the input and output matching circuits 850, 852 may be mounted on the metal submount 830. The gate lead 822A may be connected to the input matching circuit 850 by one or more bond wires 854, and the input matching circuit 850 may be connected to the gate terminal 132 of RF transistor amplifier die 1000 by one or more additional bond wires 854. Similarly, the drain lead 824A may be connected to the output matching circuit 852 by one or more bond wires 854, and the output matching circuit 852 may be connected to the drain terminal 134 of RF transistor amplifier die 1000 by one or more additional bond wires 854. The bond wires 854, which are inductive elements, may form part of the input and/or output matching circuits.

A multi-layer environmental barrier 160 as described herein is formed on the top side of the semiconductor structure 190, and may be patterned to expose the gate and drain terminals 132, 134. The multi-layer environmental barrier 160 may include two or more sublayers of respective insulating materials, for example, in a repeating layer structure, as described above. The compositions and/or thicknesses of the sublayers, the number of sublayers, and/or the number of periods, may vary based on the ionic content or other contaminants that may be present in the particular package types 800A, 800B, 800C.

FIG. 8B is a schematic side view of a packaged Group III nitride-based RF transistor amplifier 800B that includes the transistor device 1000 packaged in a printed circuit board based package structure 810B. The packaged RF transistor amplifier 800B is very similar to the packaged RF transistor amplifier 800A of FIG. 8A, except that the gate and drain leads 822A, 824A of package structure 810A are replaced with printed circuit board based leads 822B, 824B in package structure 810B.

The package structure 810B includes a submount 830, ceramic sidewalls 840, a ceramic lid 842, each of which may be substantially identical to the like numbered elements of package structure 810A discussed above. The package structure 810B further includes a printed circuit board 820. Conductive traces on the printed circuit board 820 form a metal gate lead 822B and a metal drain lead 824B. The printed circuit board 820 may be attached to the submount 830 via, for example, a conductive glue. The printed circuit board 820 includes a central opening and the RF transistor amplifier die 1000 is mounted within this opening on the submount 830. Other components of RF transistor amplifier 800B may be the same as the like-numbered components of RF transistor amplifier 800A, and hence further description thereof will be omitted.

FIG. 8C is a schematic side view of another packaged Group III nitride-based RF transistor amplifier 800C. RF transistor amplifier 800C differs from RF transistor amplifier 800A in that it includes a different package structure 810C. The package structure 810C includes a metal submount 830

(which may be similar or identical to the submount 830 of package structure 810A), as well as metal gate and drain leads 822C, 824C. RF transistor amplifier 800C also includes a plastic overmold 860 that at least partially surrounds the RF transistor amplifier die 1000, the leads 822C, 824C, and the metal submount 830. Other components of RF transistor amplifier 800C may be the same as the like-numbered components of RF transistor amplifier 800A and hence further description thereof will be omitted.

Figure 9:
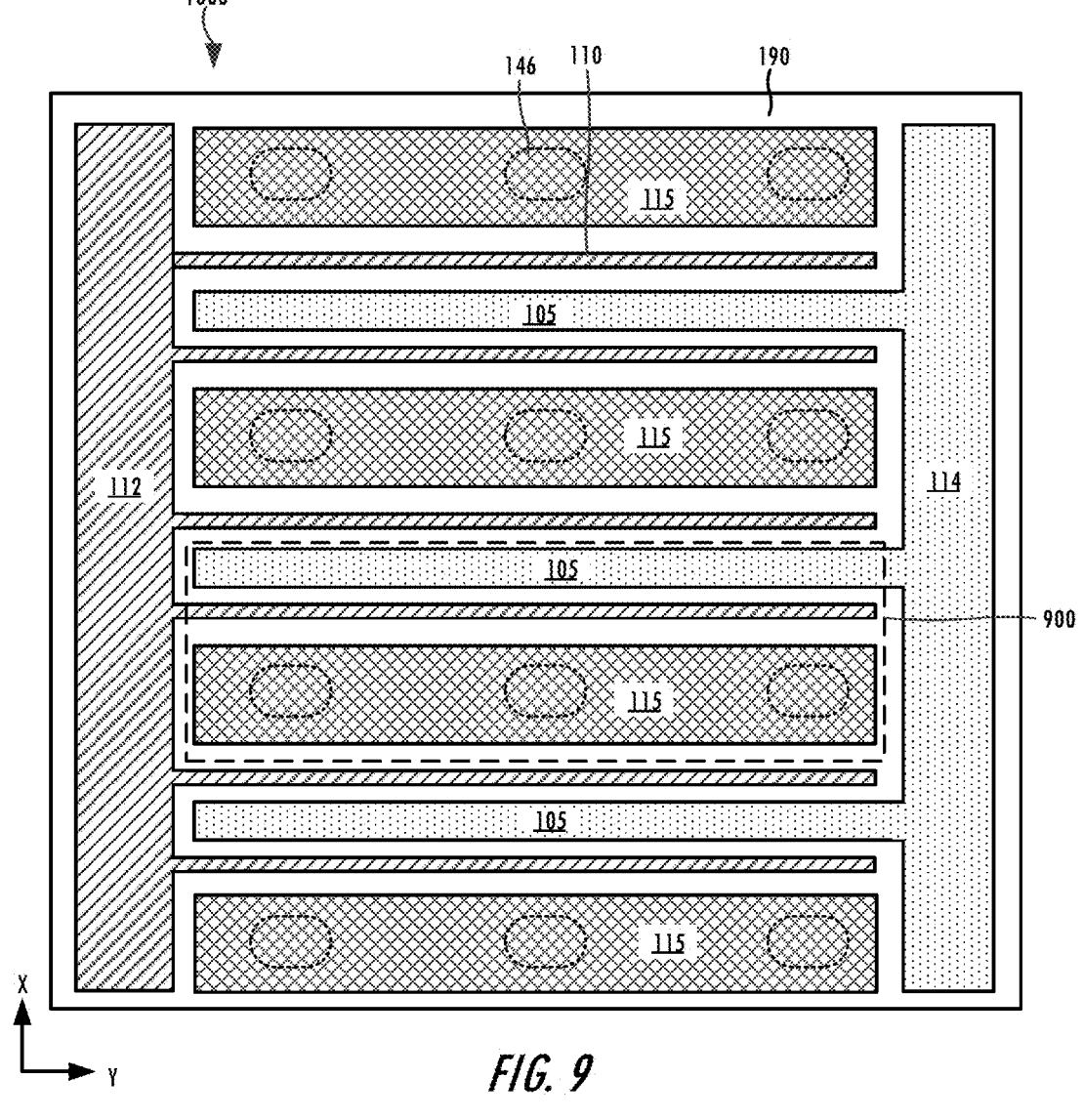
FIG. 9 is a schematic plan view of a Group III nitride-based transistor die according to embodiments of the present invention that illustrates metallization on a surface of the semiconductor layer structure thereof.

FIG. 9 is a schematic plan view of the transistor device or die 1000 that illustrates metallization on a surface of the semiconductor structure 190. The multi-layer environmental barrier 160 and/or other dielectric layers, which are provided as described herein to isolate the various conductive elements of the metallization structure from each other, are not shown in FIG. 9 to simplify the drawing.

As shown in FIG. 9, the transistor device or die 1000 may include multiple transistor structures 900 connected in parallel to device terminals or electrodes (e.g., an input terminal, an output terminal, and a ground terminal). For example, each of the gate 110, drain 105, and source 115 contacts may extend in a first direction (e.g., the Y-direction) to define gate, drain, and/or source 'fingers', which may be connected by one or more respective buses (e.g., by a gate bus 112 and a drain bus 114 on an upper surface of the semiconductor structure 190.

In FIG. 9, the gate fingers 110, drain fingers 105 and source fingers 115 extend in parallel to each other, with the gate fingers 110 extending from the gate bus 112 in a first direction and the drain fingers 105 extending from the drain bus 114 in a direction opposite the first direction. Each gate finger 110 may be positioned between a drain finger 105 and a source finger 115 to define a unit cell 900, such as the unit cell transistor structures 200, 300, 400 described herein. The gate fingers 110, drain fingers 105, and source fingers 115 (and connecting buses) may define part of gate-, drain-, and source-connected electrodes of the device, respectively, as defined by a top or frontside metallization structure. Since the gate fingers 110 are electrically connected to a common gate bus 112, the drain fingers 105 are electrically connected to a common drain bus 114, and the source fingers 115 are electrically connected together (e.g., through respective via openings 146 and a backside metal layer on the back surface of the substrate 122), it can be seen that the unit cell transistors 900 are electrically connected together in parallel.

One of the terminals of the device (e.g., a source terminal connected to the source contact(s) 115) may be configured to be coupled to a reference signal such as, for example, an electrical ground. In some embodiments, a conductive through substrate via connection or structure (e.g., a backside via opening formed through the back surface) may extend through the substrate 122 and epitaxial layer(s) 124, 126 to expose a portion of one of the contacts 105, 115, so as to allow for contact pads or terminals on the back side of the substrate (e.g., to couple the source contact 115 to ground). In other embodiments, a ground connection to one of the terminals device (e.g., the source terminal) may be provided outside the active area, e.g., in a peripheral area. In some embodiments, a backmetal layer on the back side of the substrate 122 may provide a backside ground plane, for example, in applications where proximity to ground may be desired.

Embodiments of the present invention including multi-layer environmental barrier structures as described herein may provide improved performance in passive and/or active RF devices. However, embodiments of the present invention are not limited to RF applications, and may be used in various other applications. For example, embodiments of the present invention may be used in applications with operating frequencies that range from less than about 6 GHz to Ku-band (6-18 GHz) and Ka-Band designs (e.g., 26-40 GHz). Particular embodiments of the present invention may be used various cellular infrastructure (CIFR) RF power products (including, but not limited to 5 W, 10 W, 20 W, 40 W, 60 W, 80 W and different frequency bands), e.g., for 5G and base station applications, including macro (e.g., 20-80 W and different frequency bands) average power applications. Embodiments of the present invention may also be applied to radar, monolithic microwave integrated circuit (MMIC)-type applications, dielectric crossover devices, and split gate devices. More generally, embodiments of the present invention may be used in any semiconductor IC technology that require humidity robustness.

The present invention is described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

In the drawings and specification, there have been disclosed typical embodiments of the invention, and, although specific terms have been employed, they have been used in a generic and descriptive sense only and not for purposes of limitation.

That which is claimed:

1. A semiconductor die, comprising:
   a semiconductor body comprising an inorganic semiconductor material; and
   a multi-layer environmental barrier on the semiconductor body, the multi-layer environmental barrier comprising a repeating layer structure including first and second sublayers of first and second oxide materials, respectively, wherein the first oxide material comprises a non-silicon oxide and the first sublayer is thicker and denser than the second sublayer.

2. The semiconductor die of claim 1, wherein the first and second sublayers respectively comprise Atomic Layer Deposition (ALD) layers.

3. The semiconductor die of claim 1, wherein at least one of the first or second oxide material has a density that is greater than silicon nitride.

4. The semiconductor die of claim 1, wherein at least one of the first or second oxide material comprises an insulating metal oxide.

5. The semiconductor die of claim 4, wherein the first and second oxide materials comprise the insulating metal oxide and a non-metal oxide, respectively.

6. The semiconductor die of claim 5, wherein the insulating metal oxide comprises at least one of aluminum oxide, zirconium oxide, or hafnium oxide.

7. The semiconductor die of claim 5, wherein the insulating metal oxide comprises aluminum oxide, and wherein the non-metal oxide comprises silicon oxide.

8. The semiconductor die of claim 5, wherein a ratio of a thickness of the first sublayer to a thickness of the second sublayer is about 2:1 or more, about 5:1 or more, or about 8:1 or more.

9. The semiconductor die of claim 4, further comprising:
a passivation layer between the semiconductor body and the multi-layer environmental barrier, wherein the passivation layer comprises silicon nitride.

10. The semiconductor die of claim 9, wherein a surface of the multi-layer environmental barrier opposite the passivation layer comprises a layer of silicon oxide or silicon nitride.

11. The semiconductor die of claim 1, wherein the first oxide material has a different diffusion coefficient with respect to water than the second oxide material.

12. The semiconductor die of claim 1, further comprising:
a gate, a source contact, and a drain contact on the semiconductor body; and
a passivation layer that extends on the gate, the source contact, and the drain contact,
wherein the first and second sublayers conformally extend on the passivation layer with respective thicknesses that are substantially uniform along the gate, the source contact, and the drain contact.

13. The semiconductor die of claim 1, wherein the multi-layer environmental barrier comprises at least two of the repeating layer structure, at least ten of the repeating layer structure, or at least twenty of the repeating layer structure.

14. The semiconductor die of claim 13, wherein a total thickness of the multi-layer environmental barrier is about 500 Angstroms to about 3000 Angstroms.

15. The semiconductor die of claim 13, wherein the repeating layer structure comprises:
a binary structure in which the first and second sublayers are stacked;
a ternary structure in which the first sublayer, the second sublayer, and a third sublayer are stacked; and/or
a quaternary structure in which the first sublayer, the second sublayer, a third sublayer, and a fourth sublayer are stacked.

16. A semiconductor die comprising:
a semiconductor body comprising a Group III-nitride or silicon carbide material; and
a multi-layer environmental barrier on the semiconductor body, the multi-layer environmental barrier comprising a repeating layer structure including two or more sublayers of different thicknesses, the two or more sublayers comprising a metal insulating material sublayer and a semiconductor insulating material sublayer having a density that is greater than a density of silicon nitride, wherein the metal insulating material sublayer is thicker than the semiconductor insulating material sublayer.

17. The semiconductor die of claim 16, wherein the two or more sublayers respectively comprise Atomic Layer Deposition (ALD) layers.

18. The semiconductor die of claim 17, wherein the multi-layer environmental barrier comprises at least two of the repeating layer structure, at least ten of the repeating layer structure, or at least twenty of the repeating layer structure.

19. The semiconductor die of claim 18, wherein the two or more sublayers comprises a metal oxide sublayer, and a non-metal oxide sublayer.

20. A semiconductor die comprising:
a semiconductor body comprising an inorganic semiconductor material; and
a multi-layer environmental barrier on the semiconductor body, the multi-layer environmental barrier comprising a repeating layer structure including a first insulating sublayer of a first material and a second insulating sublayer of a second material,
wherein a density of the first material is greater than a density of the second material, and
wherein a ratio of a first thickness of the first insulating sublayer to a second thickness of the second insulating sublayer is about 2:1 or more.

21. The semiconductor die of claim 20, wherein the density of at least one of the first material or the second material is greater than silicon nitride.

22. The semiconductor die of claim 20, wherein the first and second insulating sublayers respectively comprise Atomic Layer Deposition (ALD) layers.

23. The semiconductor die of claim 20, wherein the first material comprises a metal oxide, and wherein the second material comprises a non-metal oxide.

24. A method of fabricating a semiconductor die, the method comprising:
providing a semiconductor body comprising an inorganic semiconductor material; and
forming a multi-layer environmental barrier on the semiconductor body, the multi-layer environmental barrier comprising a repeating layer structure including first and second sublayers of first and second oxide materials, respectively, wherein the first oxide material comprises a non-silicon oxide and the first sublayer is thicker and denser than the second sublayer.

25. The method of claim 24, wherein forming the multi-layer environmental barrier comprises forming the first and second sublayers by Atomic Layer Deposition (ALD).

26. The method of claim 25, wherein forming the multi-layer environmental barrier comprises:
alternatingly performing a first ALD process to form the first sublayer and a second ALD process to form the second sublayer on the first sublayer in the repeating layer structure.

27. The method of claim 24, wherein at least one of the first or second oxide material has a density that is greater than silicon nitride.

28. The method of claim 24, wherein at least one of the first or second oxide material comprises an insulating metal oxide.

29. The method of claim 28, wherein the first and second oxide materials comprise the insulating metal oxide and a non-metal oxide, respectively.

30. The method of claim 27, further comprising:
forming a passivation layer on the semiconductor body prior to forming the multi-layer environmental barrier, wherein the passivation layer comprises silicon nitride.

31. The method of claim 24, wherein the semiconductor die comprises a High Electron Mobility Transistor.

32. The method of claim 24, wherein the semiconductor die comprises a Metal Oxide Semiconductor Field Effect Transistor.

33. The semiconductor die of claim 19, wherein the metal oxide sublayer comprises aluminum oxide, zirconium oxide, or hafnium oxide.

34. The semiconductor die of claim 33, wherein the non-metal oxide sublayer comprises silicon oxide.

35. The semiconductor die of claim 34, further comprising:
a passivation layer between the semiconductor body and the multi-layer environmental barrier, wherein the passivation layer comprises silicon nitride.

36. The semiconductor die of claim 20, wherein the first material comprises aluminum oxide, zirconium oxide, hafnium oxide, or silicon nitride.

37. The semiconductor die of claim 36, wherein the second material comprises silicon oxide.

38. The method of claim 29, wherein the insulating metal oxide comprises at least one of aluminum oxide, zirconium oxide, or hafnium oxide.

39. The method of claim 29, wherein the insulating metal oxide comprises aluminum oxide, and wherein the non-metal oxide comprises silicon oxide.

* * * * *